United States Patent [19]
Takada et al.

[11] Patent Number: 5,588,614
[45] Date of Patent: Dec. 31, 1996

[54] ELECTRONIC-COMPONENT SUPPLYING CARTRIDGE

[75] Inventors: Yukinori Takada, Anjo; Tokiyuki Kuno, Nagoya; Yasuo Muto, Chiryu; Koichi Asai, Nagoya, all of Japan

[73] Assignee: Fuji Machine Mfg. Co., Ltd., Aichi-ken, Japan

[21] Appl. No.: 497,750

[22] Filed: Jul. 3, 1995

[30] Foreign Application Priority Data

Jul. 7, 1994 [JP] Japan .................................. 6-156246

[51] Int. Cl.⁶ .................................................. B65H 20/02
[52] U.S. Cl. ...................................... 242/538.2; 226/139
[58] Field of Search ................................ 242/538, 538.1, 242/538.2, 548, 548.2, 564.4, 566; 226/120, 137, 138, 139; 221/70, 71, 81

[56] References Cited

U.S. PATENT DOCUMENTS

| | | | |
|---|---|---|---|
| 4,440,355 | 4/1984 | Mori et al. | 242/564.4 |
| 4,549,680 | 10/1985 | Brown | 226/139 |
| 4,586,670 | 5/1986 | Vancelette et al. | 226/120 |
| 4,620,655 | 11/1986 | Fujita | 226/120 |
| 4,657,158 | 4/1987 | Faes et al. | 221/81 |
| 4,687,152 | 8/1987 | Hawkswell | 242/538 |
| 5,020,959 | 6/1991 | Soth | 221/81 |
| 5,531,859 | 7/1996 | Lee et al. | 226/139 |

*Primary Examiner*—John P. Darling
*Attorney, Agent, or Firm*—Oliff & Berridge

[57] ABSTRACT

A cartridge for supplying a carrier tape which carries a plurality of electronic components, the tape having a plurality of pockets for accommodating the respective components, and a pair of side portions on both sides of the pockets, the pockets projecting downward from the side portions, the cartridge including a cartridge frame, a tape feeding device mounted on the cartridge frame, for feeding the carrier tape in a feeding direction, a pair of rails provided on the cartridge frame such that the rails extend parallel to the feeding direction, the pair of rails supporting the pair of the portions of the carrier tape, respectively, and permitting movement of the pockets of the tape when the tape is fed on the rails by the tape feeding device, a tape positioning device which positions the carrier tape with respect to a lateral direction in which the pair of side portions of the tape are spaced from each other, and a rail adjusting device which adjusts a spacing between the pair of rails to each of a plurality of different values.

13 Claims, 17 Drawing Sheets

ELECTRONIC-COMPONENT SUPPLYING CARTRIDGE

BACKGROUND OF THE INVENTION

1. Field of the Invention

The present invention relates to an electronic-component supplying cartridge and particularly to the art of supplying electronic-component carrier tapes having different widths.

2. Related Art Statement

An electronic-component (EC) carrier tape carries a plurality of electronic components. The EC carrier tape includes an EC accommodating tape having a plurality of pockets for accommodating the respective components, and two side portions on both sides of the pockets, respectively. The side portions extend in a longitudinal direction of the EC accommodating tape. The pockets project downward from the side portions. For example, the pockets may be provided by forming a longitudinally continuous projection projecting downward from the side portions and forming a number of upward opening recesses at regular intervals of distance in the continuous projection. In this case, the recesses function as the pockets for accommodating the components. Alternatively, the pockets may be provided by forming a number of upwardly opening containers projecting downward from the side portions at regular intervals of distance. In the second case, the containers function as the pockets for accommodating the components. A cover film covers the respective openings of the pockets of the EC accommodating tape, thereby providing the EC carrier tape.

There is known a cartridge for supplying an EC carrier tape, which includes (a) a cartridge frame, (b) a tape feeding device mounted on the cartridge frame, for feeding the carrier tape in a feeding direction, (c) a pair of rails provided on the cartridge frame such that the rails extend parallel to the feeding direction, the pair of rails supporting a pair of side portions of the carrier tape, respectively, and permitting the pockets of the carrier tape to move or pass therebetween when the tape is fed on the rails by the tape feeding device, and (d) a tape positioning device which positions the carrier tape with respect to a lateral or widthwise direction thereof in which the pair of side portions of the tape are spaced from each other.

The positioning of a carrier tape in a cubic space is achieved by positioning the tape with respect to not only a longitudinal direction thereof but also a widthwise direction thereof and a direction of thickness thereof which are perpendicular to the longitudinal direction. Usually, the longitudinal-direction positioning of the tape is done by the tape feeding device. The widthwise-direction and thickness-direction positioning of the tape is done by, for example, the pair of rails and/or a cover member covering the cartridge frame. The rails and the cover member cooperate with each other to sandwich the tape therebetween, thereby positioning the tape in the thickness direction thereof. In addition, the cover member has a pair of side portions which just contact opposite side ends of the tape, respectively, or oppose the two side ends with small clearances left therebetween, respectively. Thus, the widthwise-direction positioning of the tape is achieved.

In the above-described conventional cartridge, the pair of rails are provided such that the rails are immovable relative to the cartridge frame, and the spacing of the two rails is pre-determined at a value which ensures that the two rails respectively support the two side portions of a carrier tape to be supplied by the cartridge.

However, usually, different electronic components having different sizes are carried by different carrier tapes having different widths. Accordingly, different EC supplying cartridges having different spacings of rails are needed for supplying different carrier tapes having different widths. Many sorts of EC supplying cartridges are needed and each sort of cartridges are needed only in a small number. Thus, the production cost of the cartridges as a whole increases to a disadvantage. Moreover, since the total number of the cartridges increases, the maintenance cost of the same increases to another disadvantage.

SUMMARY OF THE INVENTION

It is therefore an object of the present invention to provide an electronic-component supplying cartridge which can supply different sorts of electronic-component carrier tapes having different widths, i.e., different distances of side portions.

The above object has been achieved by the present invention, which provides a cartridge for supplying a carrier tape which carries a plurality of electronic components, the tape having a plurality of pockets for accommodating the respective components, and a pair of side portions on both sides of the pockets, the pockets projecting downward from the side portions, the cartridge comprising: a cartridge frame; a tape feeding device mounted on the cartridge frame, for feeding the carrier tape in a feeding direction; a pair of rails provided on the cartridge frame such that the rails extend parallel to the feeding direction, the pair of rails supporting the pair of side portions of the carrier tape, respectively, and permitting movement of the pockets of the tape when the tape is fed on the rails by the tape feeding device; a tape positioning device which positions the carrier tape with respect to a lateral direction in which the pair of side portions of the tape are spaced from each other; and a rail adjusting device which adjusts a spacing between the pair of rails to each of a plurality of different values.

In the electronic-component (EC) supplying cartridge constructed as described above, the rail adjusting device is operable to adjust the spacing or distance between the pair of rails, from one of the different values to another value or the other value, for example, in the case where the rails having the current spacing equal to said one value cannot support the side portions of a carrier tape to be supplied by the present cartridge. The rails having the adjusted spacing equal to said another or said other value can support the side portions of the carrier tape in issue. The rail adjusting device may comprise a removable rail adjusting member which is removably attached to the cartridge frame to adjust or change the spacing of the rails, or a movable rail adjusting member which is attached to the cartridge frame such that the adjusting member is movable in the widthwise direction of the frame parallel to the lateral direction of the carrier tape. Thus, a single EC supplying cartridge in accordance with the present invention can supply a plurality of sorts of carrier tapes having different spacings of side portions. Therefore, only fewer sorts of cartridges are needed to supply many sorts of carrier tapes and the overall production cost of the cartridges is reduced. In addition, the total number of the cartridges decreases and the cartridges which are not in use are kept in a smaller space. Thus, the cartridges can be maintained more easily.

In a preferred embodiment in accordance with the invention, the rail adjusting device comprises a removable rail adjusting member which is removably attached to the cartridge frame, the adjusting member providing at least one of the pair of rails. In this case, the spacing of the rails is easily adjusted by attaching the removable rail adjusting member to the cartridge frame, or detaching the adjusting member from the frame. One or both of the pair of rails may be formed literally integrally with the cartridge frame, or may be formed separately from the frame and then unremovably fixed to the frame. Hereinafter, the thus obtained rail or rails is/are referred to as "integral" rail or rails. In the case where a pair of integral rails are provided on the cartridge frame, the removable rail adjusting member may comprise (a) a two-rail-type removable rail adjusting member providing a pair of rails which are separate from the integral rails and are removably attached between the integral rails, or (b) a one-rail-type removable rail adjusting member providing a single rail which is separate from the integral rails, is removably attached adjacent to one of the integral rails, and functions as a rail in place of said one integral rail. The two-rail-type removable rail adjusting member may be formed as (a-1) an integral-two-rail-type removable rail adjusting member wherein the two rails thereof are formed integrally with each other to have, e.g., a generally U-shaped cross section, or (a-2) a separate-two-rail-type removable rail adjusting member wherein the two rails thereof are formed separately from each other and each rail is individually attached to the cartridge frame. In the case where (a-1) the integral-two-rail-type removable rail adjusting member or (b) the one-rail-type removable rail adjusting member is employed, the spacing of the rails is changeable in two steps or values, one value without the adjusting member and the other value with the adjusting member. When (a-2) the separate-two-rail-type removable rail adjusting member is used in such a manner that the two separate rails are simultaneously attached to, and detached from, the cartridge frame, the adjusting member is substantially the same as (a-1) the integral-two-rail-type removable rail adjusting member. However, if (a-2) the adjusting member is used in such a manner that only one of the two separate rails is attached to, and detached from, the cartridge frame, independently of the other rail, the spacing of the rails is changeable to each of three values. In the case where the removable rail adjusting member is attached to the cartridge frame in such a manner that the adjusting member is held in close contact with an inner side surface of one of the integral rails, the side surface of said one integral rail functions as an adjusting-member positioning device which positions the adjusting member in the widthwise direction of the frame. In the last case, the spacing of the rails is changeable in three or more values, by employing two or more removable rail adjusting member having different widths and selectively attaching them to the frame. In the case where (a-2) the separate-two-rail-type removable rail adjusting member or (b) the one-rail-type removable rail adjusting member is employed, the spacing of the rails is changeable in three or more values, without having to prepare a plurality of adjusting member having different widths. This is achieved by just changing the position of attachment of the adjusting member relative to the cartridge frame. In the last case, it is preferred that an adjusting-member positioning device, separate from the integral rails, be provided for positioning the adjusting member in the widthwise direction of the frame. This adjusting member functions as not only a removable adjusting member but also a movable adjusting member. In the case where only one of the pair of rails is an integral rail, the removable rail adjusting member comprises one or more removable rails each of which functions as the other rail, and/or one or more removable rails each of which can be used in place of the integral rail. In the last case, the rail spacing is adjustable in two or more values, by employing two or more removable rails having different widths, or by changing the position of attachment of a single removable rail relative to the frame. In the case where neither of the pair of rails is an integral rail, the removable rail adjusting member comprises two removable rails which function as the pair of rails of the cartridge. In the last case, the rail spacing is adjustable in two or more values, by changing the spacing of the two removable rails. In any case where one of the pair of rails is an integral rail and cannot be replaced by any other rail, a cover member which covers said one rail may be used as the tape positioning device for positioning the carrier tape in the lateral direction thereof, in such a manner that an inner side surface of one of two side portions of the cover member which portion is adjacent to said one rail contacts one of two side ends of the carrier tape. On the other hand, in the case where neither of the pair of rails is an integral rail, or where one or two integral rails can be replaced by another or other removable rails in order to reduce the rail spacing, it is required that a cover member suitable for the integral rail or rails be replaced by another cover member suitable for the removable rail or rails, so that said another cover member may function as the tape positioning device. Alternatively, in any case, it is possible that one or both of the pair of rails may be used as the tape positioning device, e.g., in such a manner that the rail is formed with a stepped surface which just contacts one side end of the carrier tape, or with an inner side surface which just contacts an outer side surface of the pockets of the tape.

In another embodiment in accordance with the invention, the rail adjusting device comprises: a movable rail adjusting member which is attached to the cartridge frame such that the adjusting member is movable in the lateral direction; and an adjusting-member positioning device which positions the movable rail adjusting member at each of a plurality of different positions in the lateral direction. In this embodiment, the movable rail adjusting member may provide a movable rail as one of the pair of rails of the cartridge, and the other rail may be an integral rail. In the last case, the two side portions of the carrier tape are supported by the movable and integral rails, respectively. The movable rail are movable to a selected one of the different positions where the movable rail cooperates with the integral rail to support the carrier tape to be supplied. The different positions may be continuously or steplessly selectable or may be stepwise selectable. In the former case, the adjusting-member positioning device steplessly positions the movable rail adjusting member; and in the latter case, the positioning device stepwise positions the adjusting member. In the case where the position of the adjusting member is steplessly adjusted, the spacing of the rails can be changed to a value equal to the width of the pockets of the tape, so that respective inner surfaces of the two rails cooperate with each other to function as the tape positioning device for positioning the pockets of the tape in the lateral or widthwise direction of the tape. Alternatively, one or both of the two rails may be formed with a stepped surface which just contacts one or both of respective outer side ends of the two side portions of the tape, so that the stepped surface may function as the tape positioning device. Either in the case where the rail spacing is steplessly adjustable, or in the case where the rail spacing is stepwise adjustable, the rail spacing is adjustable to each of a plurality of different positions, by using a single movable rail adjusting member. Thus, the rail adjusting device can be produced at low cost.

In another embodiment in accordance with the invention, the rail adjusting device comprises a rail adjusting member providing one of the pair of rails, the other rail being provided as a part of the cartridge frame. In this case, the rail adjusting member may be removable or movable. In any case, the spacing of the two rails can be adjusted by using a single rail adjusting member. Thus, the number of the rail adjusting members needed for the invention cartridges as a whole is reduced, and the production cost of the same is also reduced.

In another embodiment in accordance with the invention, the rail adjusting device comprises a pair of rail adjusting members providing the pair of rails, respectively, the rail adjusting device adjusting a spacing between the pair of rail adjusting members such that a center of the spacing does not change even after the spacing is adjusted to the each of the different values. In this case, the rail adjusting members may be movable or removable. In the case of the movable rail adjusting members, the rail spacing is adjusted by moving the two adjusting members symmetrically with each other with respect to a point or line as the center of the rail spacing. In the case of the removable rail adjusting members, the rail spacing is adjusted by attaching or detaching, to or from the cartridge frame, the two adjusting members (i.e., (a-2) the above-mentioned separate-two-rail-type removable rail adjusting member) symmetrically with each other with respect to the center of the rail spacing, or alternatively by attaching or detaching a single removable member having two rail-adjusting top surfaces symmetrical with each other (i.e., (a-1) the above-mentioned integral-two-rail-type removable rail adjusting member). Since the center of the rail spacing does not change even after the rail spacing is adjusted or changed, the center line of the pockets of each carrier tape supplied by the present cartridge does not change even if different carrier tapes having different widths are supplied. For example, when the present cartridge supplies different sorts of electronic components having different widths which are respectively carried by different carrier tapes having different widths, the EC picking-up position where a suction nozzle picks up by air suction the components from the respective pockets of each of the different tapes need not be changed with respect to the widthwise direction of the cartridge frame in which direction the two rails are spaced from each other. In the case of the movable rail adjusting members, the rail spacing may be changed steplessly or stepwise. In any case, one or both of the two rails may be used as the tape positioning device in the same manners as described above.

In another embodiment in accordance with the invention, the tape feeding device comprises: a driver member which is movable in a first direction and a second direction different from the first direction; a feeding mechanism which feeds the carrier tape based on the movement of the driver member in the first direction and does not transmit, to the tape, the movement of the driver member in the second direction; a first-direction stopper which defines a first limit of movement of the driver member in the first direction; and a second-direction stopper which defines a second limit of movement of the driver member in the second direction. When the driver member is moved in the first direction, the carrier tape is fed by the feeding mechanism; and when the driver member is moved in the second direction, the tape is not fed, but the feeding mechanism prepares for feeding the tape when the driver member is again moved in the first direction. Therefore, the pitch of feeding of the carrier tape by the feeding mechanism can be changed by changing one of the first and second limits of movement of the driver member. For example, in the case where the first limit cannot be changed and the second limit can be changed depending upon a selected tape feeding pitch, the leading one of the electronic components accommodated in the pockets of the carrier tape is moved to the EC picking-up position which need not be changed in the tape feeding direction even if the tape feeding pitch is changed. The present cartridge may further comprise a drive source for driving the driver member of the tape feeding device, the drive source being mounted on the cartridge frame. Since the present cartridge has an exclusive drive source, the cartridge can be used with any apparatus whose drive source cannot be shared by the cartridge. The drive source may comprise an air cylinder. The air cylinder can be produced at low cost. The air cylinder may be of a single-acting type or a double-acting type.

According to a preferred feature of the invention, the second-direction stopper comprises: a first stopper member which is movable together with the driver member; a movable member which is attached to the cartridge frame such that the movable member is movable and adjustable with respect to a position thereof relative to the frame; at least one second stopper member which is provided on the movable member and defines the second limit of movement of the driver member by abutting the first stopper member movable with the driver member; and a free-movement preventing device which prevents a free movement of the movable member relative to the cartridge frame. When the pitch of feeding of the carrier tape is changed to a desired one, the free-movement preventing device is operated by the operator to permit the movement of the movable member relative to the cartridge frame, so that the movable member can be moved and adjusted to a position thereof relative to the frame which position defines the second limit of movement of the driver member such that the second limit corresponds to the desired tape feeding pitch. Thereafter, the free-movement preventing device is again operated to prevent or inhibit the movement of the movable member relative to the frame. In the case where the second-direction stopper comprises a plurality of second stopper members which are provided on the movable member and each of which defines a corresponding one of a plurality of different second limits of movement of the driver member by abutting the first stopper member moved with the driver member, the movable member is moved such that a selected one of the second stopper members is moved to the second-direction-movement limiting position where the selected second stopper is abutable on the first stopper member to stop the movement of the driver member in the second direction. Thus, the tape feeding pitch is changeable in two or more values. Even in the case where the second-direction stopper comprises a single second stopper member provided on the movable member, an attachment member with which the movable member is attached to the cartridge frame may be used as another second stopper member, so that the tape feeding pitch is changeable to two values. The present cartridge can supply not only different sorts of carrier tapes having different widths, but also different sorts of carrier tapes having different feeding pitches. In the present cartridge, the tape feeding pitch can be changed easily and quickly. The tape feeding pitch can be changed in other manners. For example, the tape feeding pitch can be changed by employing different stopper members which define different second limits of movement of the driver member, respectively. In the last case, one of the different stopper members is selected which corresponds to a desired feeding pitch, and the selected stopper member is attached to the cartridge frame. However, the number of the stoppers increases, and the operator is required to replace the current stopper member with another stopper member each time the current feeding pitch is changed to a new one. In the present cartridge including the second-direction stopper having the preferred feature described above, the tape feeding pitch can easily and quickly be changed by just moving the movable member. In addition, the single movable member can be maintained more easily than the plurality of stopper members.

According to another feature of the invention, the second-direction stopper further comprises an attachment member secured to the cartridge frame, the movable member being attached to the attachment member such that the movable member is movable, relative to the attachment member, to a position thereof where the movable member causes a portion of the attachment member to be exposed and opposed to the first stopper member movable with the driver member. When the present cartridge is in a situation in which the movable member is moved to, and located at, a position thereof where the movable member causes a portion of the attachment member to be exposed and opposed to the first stopper member, that portion of the attachment member functions as the second stopper member to stop the movement of the driver member in the second direction by abutting the first stopper member. In the case where the movable member supports one second stopper member provided thereon and is movable to a position thereof to cause a portion of the attachment member to be exposed and opposed to the first stopper member, the second-direction stopper comprises two second stopper members one of which is provided by one supported by the movable member and the other of which is provided by that portion of the attachment member. The attachment member may be formed as an integral portion of the cartridge frame, or as a separate member from the frame.

According to another feature of the invention, the movable member of the second-direction stopper comprises a rotary member which is rotatable about an axis line, the at least one second stopper member comprising a plurality of second stopper members provided along a circle whose center rides on the axis line of the rotary member. When the present cartridge is in a situation in which the free-movement preventing device is operated by the operator to permit the movement of the rotary member as the movable member relative to the cartridge frame, the rotary member can be rotated so that a selected one of the second stopper members is moved to the second-direction-movement limiting position where the selected second stopper member is abutable on the first stopper member to thereby define a corresponding second limit of movement of the driver member in the second direction. The rotary member may be a circular plate, one obtained by cutting a circular plate, a rectangular plate, a cross-shaped plate, or a polygon-shaped plate. In the case where a rotary member is employed as the movable member, the rotary member can be accommodated in a small space within the cartridge frame. In the case where a linearly movable member is used as the movable member, the cartridge frame needs a larger space to permit the linear movement of the movable member, than the space occupied by the same. In contrast, the rotary member can be moved or rotated almost within the space occupied thereby and accordingly does not need any additional space to permit the rotation thereof. Various mechanisms such as the tape feeding mechanism are provided on the cartridge frame, and it is difficult to allot a large space to the movable member of the second-direction stopper. Since the rotary member as the movable member needs a small space only, the second-direction stopper can easily be provided on the cartridge frame.

According to a preferred embodiment of the invention, the cartridge further comprises: a taking-up device which has a take-up drum and takes up, around the take-up drum, a cover film covering respective openings of the pockets of the carrier tape being fed by the tape feeding device; and a holder device which holds a tape storage device in which the carrier tape is stored, the holder device holding the tape storage device such that the tape is continuously fed from the storage device to the pair of rails, the take-up drum being positioned relative to the tape storage device and the pair of rails such that the carrier tape is fed from the storage device to the rails by being guided by a guide roller provided by the take-up drum or the cover film being wound around the drum. The carrier tape may be engaged with a portion of a circumferential surface of the guide roller such that a direction of feeding of the tape from the tape storage device to the pair of rails via the portion of the roller is same as a direction of movement of the portion of the roller. As the carrier tape is fed by the tape feeding device, the cover film of the tape is taken up by the rotation of the take-up drum of the taking-up device, and is wound around the take-up drum. Simultaneously, a portion of the outer circumferential surface of the take-up drum or the cover film wound around the drum which portion is moved in the same direction as the feeding direction of the carrier tape, engages the carrier tape and functions as a guide roller for guiding the tape being fed from the tape storage device toward the pair of rails. Since the present cartridge does not need an exclusive guide roller, the production cost of the cartridge is reduced. The diameter of the cover film wound around the take-up drum increases with the feeding of the carrier tape. However, the angular velocity of the take-up drum decreases with the increasing of the diameter of the taken-up cover film, so that the amount of movement of the outer circumferential surface of the taken-up cover film per unit time, i.e., the amount of movement of the cover film per unit time is kept substantially equal to the amount of the carrier tape per unit time. Therefore, substantially no slippage is observed between the outer circumferential surface of the taken-up cover film and the carrier tape being fed. Accordingly, there may be produced, without any problem, a great resistance between the taken-up cover film and the carrier tape. However, the taken-up cover film can apply an additional force to the carrier tape, thereby assisting the tape feeding device in feeding the carrier tape from the tape storage device toward the pair of rails.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
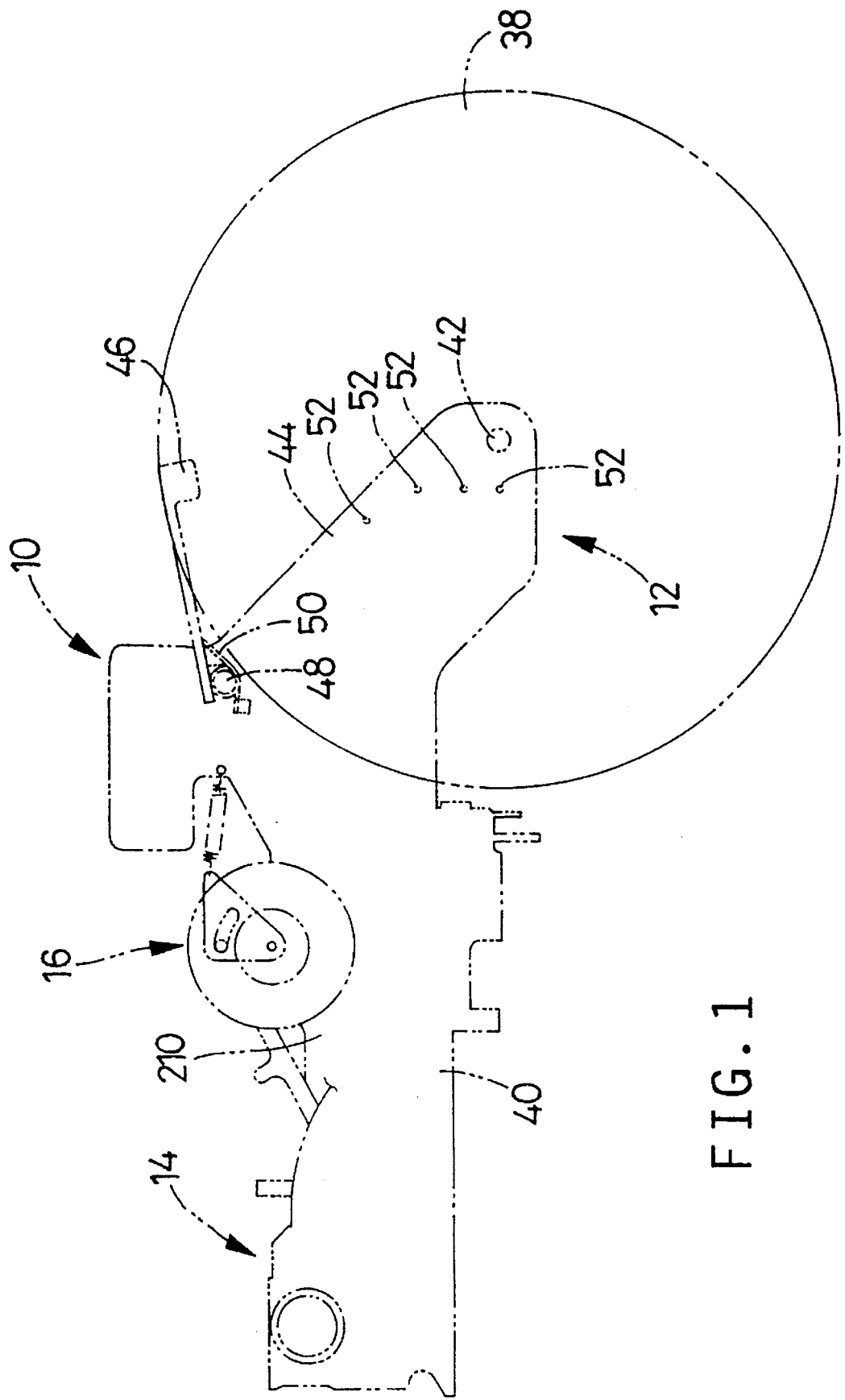
FIG. 1 is a front view of an electronic-component supplying cartridge embodying the present invention.

Referring first to FIG. 1, there is shown an electronic-component supplying cartridge 10 to which the present invention is applied.

Figure 13:
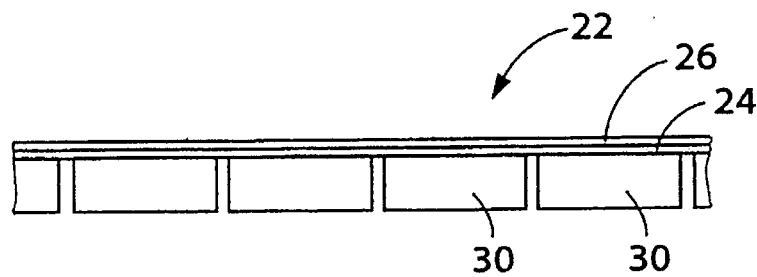
FIG. 13 is a front view of a carrier tape which is fed by the tape feeding device of the cartridge of FIG. 1.

The cartridge 10 includes a tape-reel holding device 12, a tape feeding device 14, and a film taking-up device 16. The tape-reel holding device 12 holds a tape reel as a tape storage device around which a carrier tape 22 (FIG. 2) is wound. The carrier tape 22 includes an electronic-component (EC) accommodating tape 24, and a thin, transparent cover film 26, as shown in FIG. 13. The tape feeding device 14 feeds the carrier tape 22 in a feeding direction (described later). The film taking-up device 16 takes up the cover film 26 from the carrier tape 22 being fed by the feeding device 14.

Figure 14:
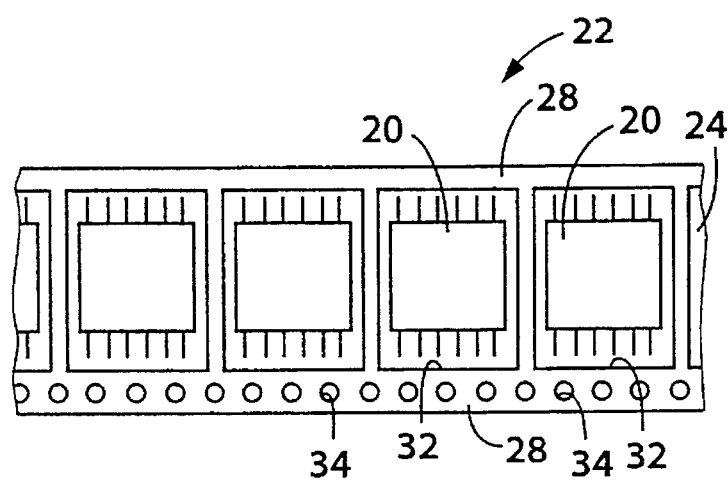
FIG. 14 is a plan view of the carrier tape of FIG. 13 from which a cover film has been removed by the film taking-up device of the cartridge of FIG. 1.
Figure 15:
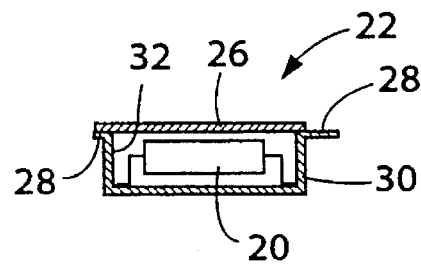
FIG. 15 is a side view, in cross section, of the carrier tape of FIG. 13.

As shown in FIGS. 13–15, the EC accommodating tape of the carrier tape 22 has a series of container-like pockets 30 each of which accommodates an electronic component 20 with leads, and a pair of side portions 28, 28 which are provided on both sides of the series of pockets 30 and extend parallel to each other in a longitudinal direction of the EC accommodating tape 24. Each container-like pocket 30 projects downward from the level of side portions 28, 28, and has an opening 32 in an upper surface of the tape 24. The pockets 30 are equidistant from each other on the carrier tape 22. In the following description, the electronic components 20 accommodated in the pockets 30 of the carrier tape 22 will be referred to simply as the carrier tape 22.

The cover film 26, adhered to the upper surface of the EC accommodating tape 24, covers the respective openings 32 of the pockets 30. One of the two side portions 28, 28 has an array of perforations 34 formed through the thickness thereof. The perforations 34 are equidistant from each other in the longitudinal direction of the tape 24.

The tape reel 38, around which the carrier tape 22 is wound, is detachably attached to a rear end portion 44 of a cartridge frame 40 via a first axis member 42. The end portion 44 and the axis member 42 cooperate with each other to provide the tape-reel holding device 12 of the cartridge 10. A resisting member 46 is pivotally attached to the end portion 44 via a second axis member 48, and a spring 50 biases the resisting member 46 in a direction to contact an outer circumferential surface of the tape reel 38. Thus, the resisting member 46 resists the rotation of the tape reel 38.

The end portion 44 has a plurality of insertion holes 52 into each of which the first axis member 42 can be inserted. The insertion holes 52 are provided for supporting different tape reels 38 having different diameters, so that the resisting member 46 suitably resists the rotation of each tape reel 38. Electronic components of different sizes are accommodated in carrier tapes of different sizes, respectively, which in turn are wound around tape reels 38 of different diameters, respectively.

The carrier tape 22 which is wound around the tape reel 38 held by the tape-reel holding device 12, is sent to the tape feeding device 14 via the film taking-up device 16. The taking-up device 16 also functions as a guiding device for guiding the carrier tape 22 in a manner described later.

Figure 11:
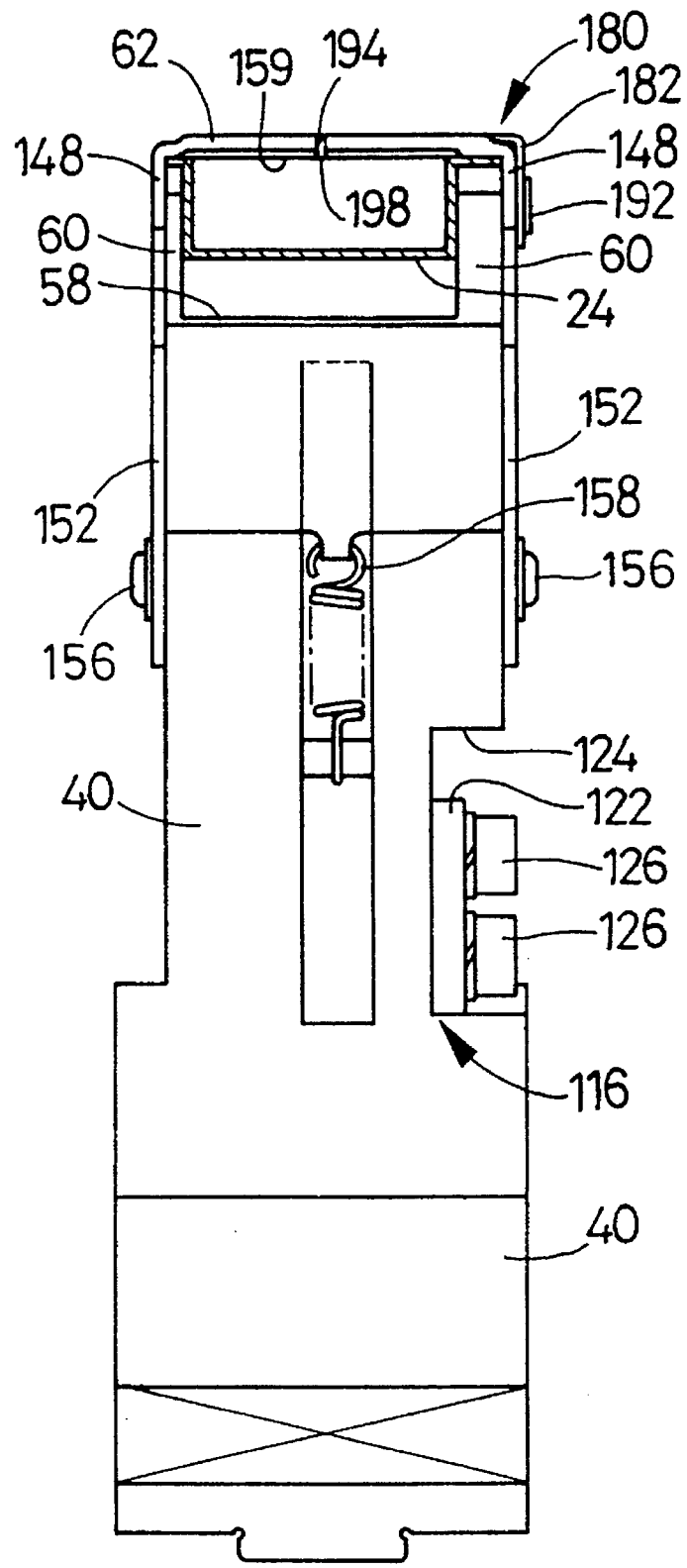
FIG. 11 is a side view of the cartridge frame of the cartridge of FIG. 1 to which the spacing adjusting block is not attached.

The cartridge frame 40 has an elongate, thin box-like configuration and stands such that the lengthwise and thickness-wise directions thereof are horizontal and the width-wise direction thereof is vertical. As shown in FIG. 11, a front end portion of the frame 40 supports a pair of rails 60, 60 which project from a top surface 58 of the frame 40 and extend parallel to each other in the tape feeding direction in which the carrier tape 22 is fed by the tape feeding device 14. The pair of rails 60, 60 can support, from underside, the pair of side portions 28, 28 of the EC accommodating tape 24 of each of different carrier tapes 22 having different widths, when each carrier tape 22 is fed on the rails 60 by the feeding device 14. The two rails 60, 60 are spaced from each other by a spacing or distance which permits the pockets 30 of the tape 24 to pass therethrough.

As shown in FIG. 11, the pair of side portions 28, 28 of the carrier tape 22 are supported from the underside thereof by the pair of rails 60, 60, and are covered with a cover member 62. Thus, the carrier tape 22 is fed by the feeding device 14 such that the side portions 28, 28 are sandwiched between the rails 60, 60 and the cover member 62.

Figure 2:
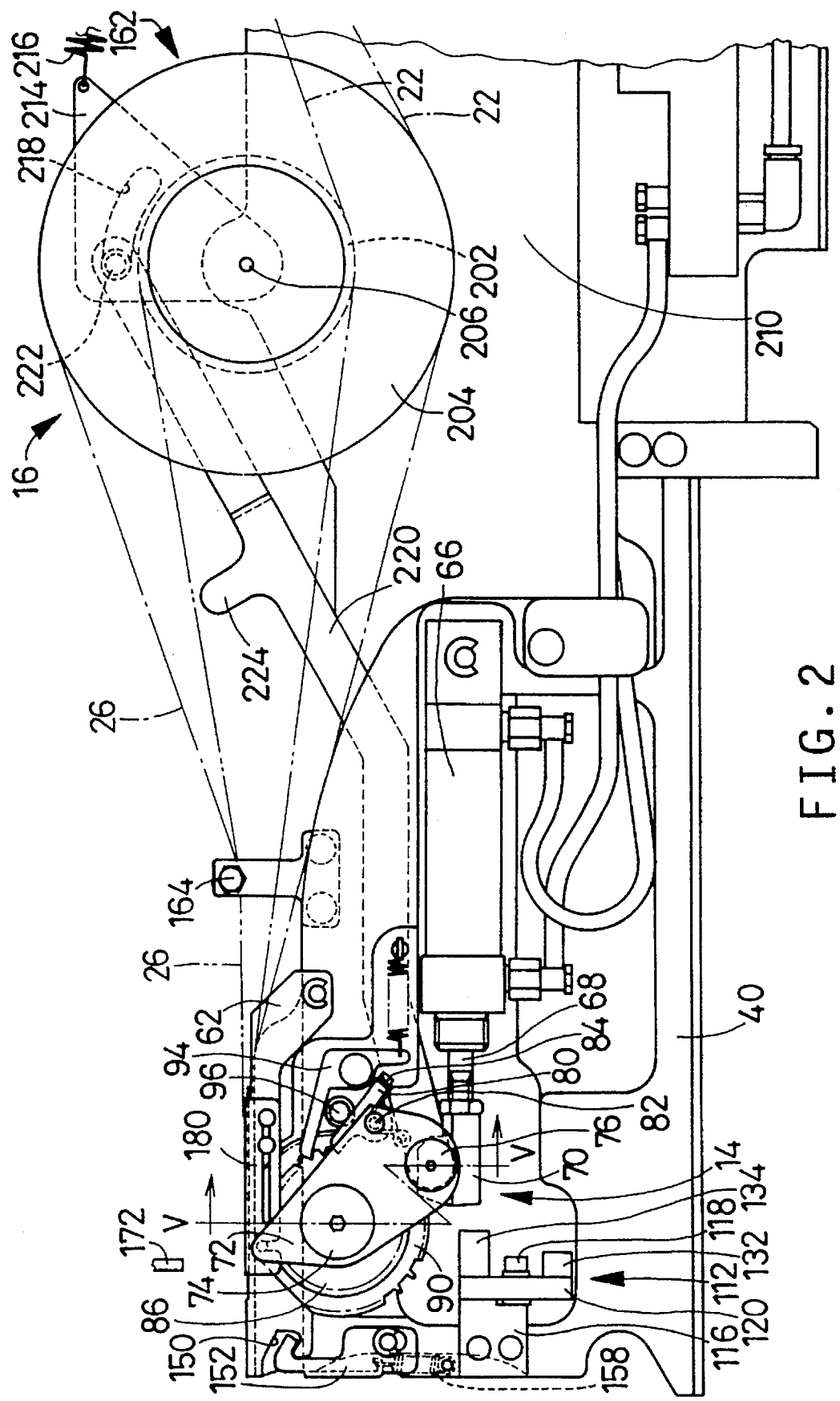
FIG. 2 is a front view of a tape feeding device and a film taking-up device of the cartridge of FIG. 1.

The tape feeding device 14 intermittently feeds the carrier tape 22 in the feeding direction contained in the horizontal plane, by a predetermined feeding pitch equal to the distance between the respective centers of each pair of adjacent pockets 30 of the EC accommodating tape 24. As shown in FIG. 2, the tape feeding device 14 includes an air cylinder 66 and a piston rod 68 which is advanced from, and retracted into, the air cylinder 66. The air cylinder 66 is of a double-acting type and has two air chambers which are selectively communicated with an air source (not shown) and the atmosphere, respectively.

Figure 5:
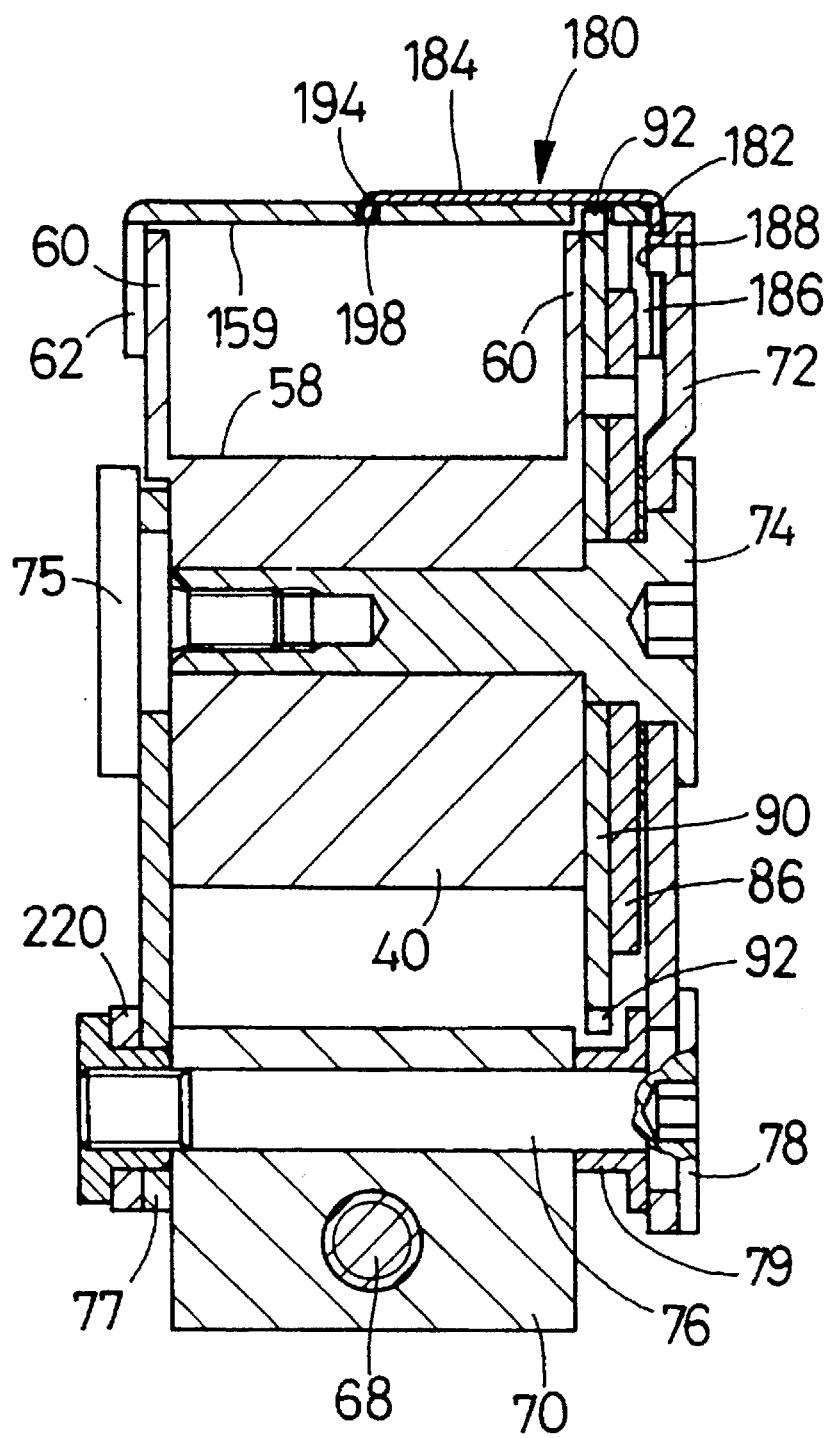
FIG. 5 is a cross-section view of the cartridge of FIG. 1 taken along Line 5—5 of FIG. 2.

A stopper block 70 is fixed to an end portion of the piston rod 68, and a rotary plate 72 is connected to the stopper block 70 such that the plate 72 is rotatable relative to the block 70. A central portion of the rotary plate 72 is connected to one of opposite end portions of a third axis member 74 which is fixed to the cartridge frame 40 by being fastened with a screw member 75 (FIG. 5). Thus, the rotary plate 72 is rotatable about a horizontal axis line perpendicular to the tape feeding direction. As shown in FIG. 5, a bottom portion of the rotary plate 72 fits on a fourth axis member 76 fixed to the stopper block 70, such that the plate 72 is rotatable about the axis member 76. When the piston rod 68 is retracted and advanced by the air cylinder 66, the rotary plate 72 is rotated in a forward and a backward direction thereof, respectively, as seen at the place where the carrier tape 22 is fed on the pair of rails 60, 60. Opposite end portions of the fourth axis member 76 project from the stopper block 70. The rotary plate 72 fits on one of the end portions of the axis member 76, and a link 77 fits on the other end portion of the axis member 76 such that the link 77 is rotatable relative to the axis member 76. The link 77 is also connected to the other end portion of the third axis member 74 such that the link 77 is rotatable relative to the axis member 74. The rotary plate 72 is sandwiched with precision between a head portion 78 of the fourth axis member 76 and a flange of a sleeve 79, so that the rotation of the plate 72 relative to the axis member 76 and the stopper block 70 is permitted and the tilting of the axis member 76 is prevented. The link 77 also functions to prevent the tilting of the axis member 76.

As shown in FIG. 2, a ratchet pawl 80 is rotatably connected to the rotary plate 72 via a fifth axis member 82. A spring 84 as a biasing member biases the ratchet pawl 80 in a direction in which the pawl 80 engages the teeth 88 of a ratchet wheel 86. The ratchet wheel 86 is fixed to a sprocket 90 so that the wheel 86 is not rotatable relative to the sprocket 90. The sprocket 90 is rotatably supported by the third axis member 74. Teeth 92 of the sprocket 90 are engaged with the perforations 34 of the EC accommodating tape 24 of the carrier tape 22. When the piston rod 68 is retracted and the rotary plate 72 is rotated in the forward direction thereof, the ratchet pawl 80 connected to the plate 72 is moved in engagement with the teeth 88 of the ratchet wheel 86, so that the ratchet wheel 86 is rotated in a forward direction thereof and accordingly the sprocket 90 is rotated in a forward direction thereof. Consequently the EC accommodating tape 24, i.e., the carrier tape 22 is fed in the feeding direction.

The limit of forward-direction rotation of the rotary plate 72 is defined by a stopper projection 96 on which the ratchet pawl 80 is abutable. The stopper projection 96 is fixed to the cartridge frame 40. Thus, the feeding device 14 feeds the carrier tape 22 such that the leading one of the components 20 accommodated in the pockets 30 from which the cover film 26 has already been removed is sent to a predetermined EC picking-up position where each leading component 20 is picked up, one after another, by an EC mounting apparatus (not shown).

When the piston rod 68 is advanced by the air cylinder 66 and the rotary plate 72 is rotated in the backward direction thereof, the ratchet pawl 80 moves over the teeth 88 of the ratchet wheel 86. In this situation, the rotation of the ratchet wheel 86 is inhibited by a stopper lever 94. Thus, the carrier tape 22 is prevented from moving in the feeding direction. In addition, the leading component 20 is inhibited from moving out of the EC picking-up position. Thus, the stopper lever 94 also functions to position the leading component 20 at the EC picking-up position. When the rotary plate 72 is rotated in the forward direction thereof, the ratchet wheel 86 is rotated by an angle equal to a central angle corresponding to the number of teeth 88 which the ratchet pawl 80 had moved over during the prior backward-direction rotation of the plate 72. Thus, the pitch of feeding of the carrier tape 22 is defined as the number of teeth 88 which the ratchet pawl 80 moves over in each backward-direction rotation of the rotary plate 72. Therefore, the feeding pitch of the carrier tape 22 can be changed by changing the limit of backward-direction rotation of the rotary plate 72.

Figure 6:
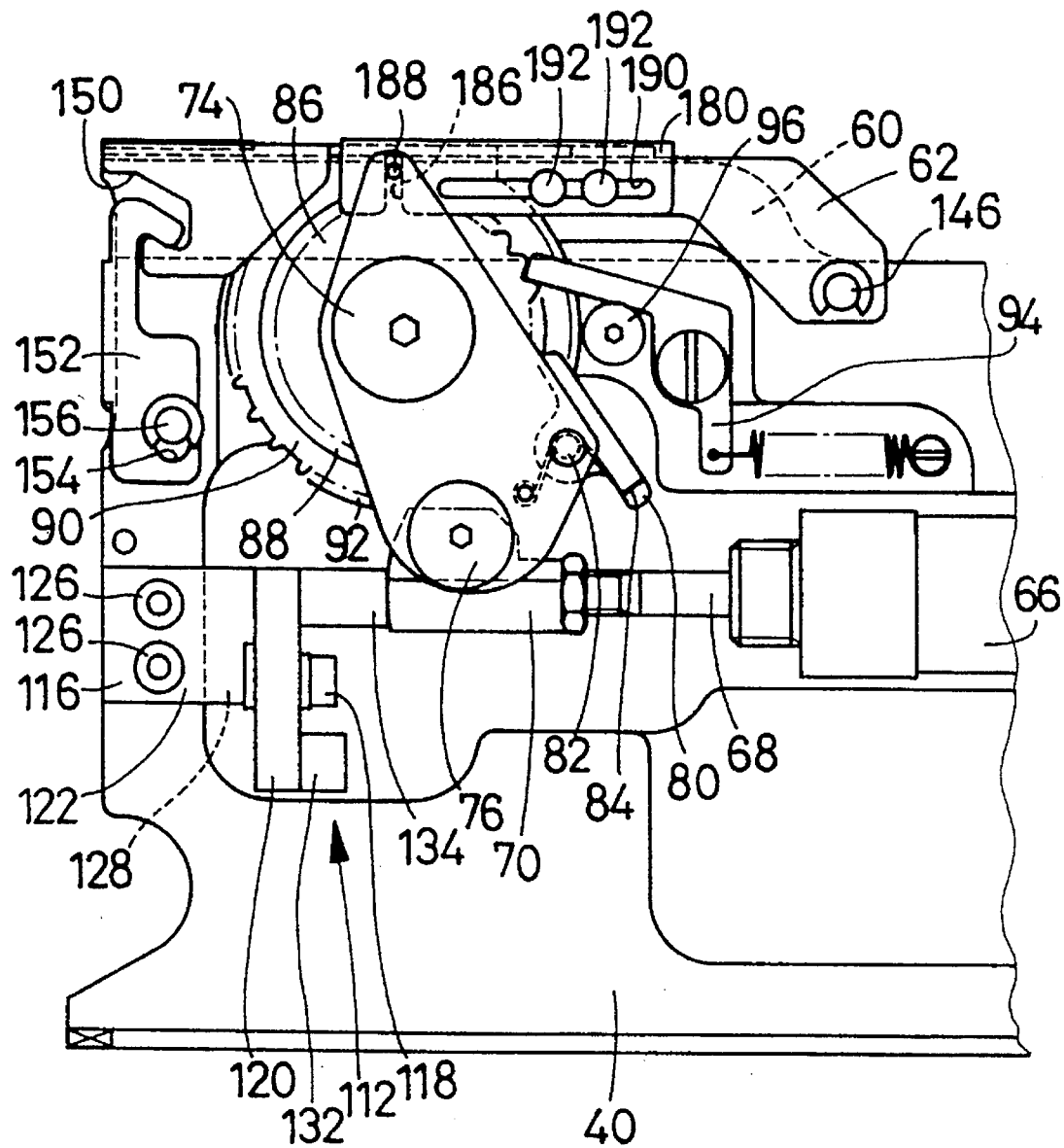
FIG. 6 is a front view of the tape feeding device of the cartridge of FIG. 1 in which a rotary plate as a part of the feeding device is rotated in a backward direction opposite to a forward direction in which to feed a carrier tape forward in a tape feeding direction.

The limit of backward-direction rotation of the rotary plate 72 is defined by a backward-direction stopping device 112 provided on the cartridge frame 40. The stopping device 112 includes a base member 116 fixed to the frame 40, and a rotary member 120 secured to the base member 116 with a bolt 118. As shown in FIGS. 11 and 6, the base member 116 includes a first portion 122 fixed with bolts 126 to the frame 40, within a recess 124 formed in the front end portion of the frame 40, and a second portion 128 extending horizontally toward a central portion of the frame 40.

Figure 10:
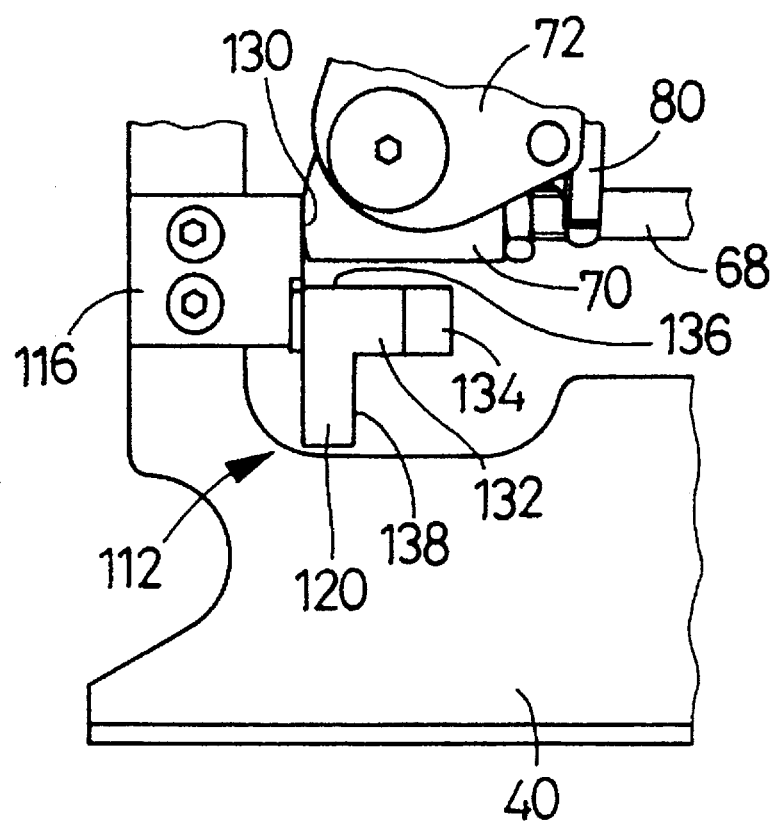
FIG. 10 is a front view of the rotary member of FIG. 7 which takes an angular phase different from the angular phases thereof shown in FIGS. 6, 8, and 9 and defines a different limit of backward movement of the rotary plate shown in FIG. 6.

As shown in FIG. 10, the second portion 128 of the base member 116 has an end face 130 on the side of the air cylinder 66. The position of the end face 130 defines a limit of the advancing movement of the piston rod 68, i.e., a limit of the backward-direction rotation of the rotary plate 72 which corresponds to the greatest one of the four tape feeding pitches available on the present cartridge 10.

Figure 7:
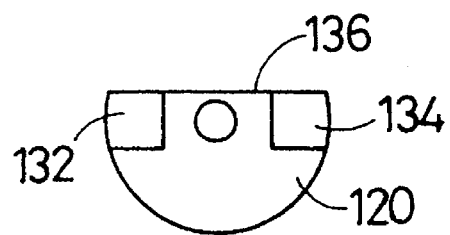
FIG. 7 is a front view of a rotary member as a backward-direction stopping device of the cartridge of FIG. 1.

As shown in FIG. 7, the rotary member 120 includes a first and a second stopper projection 132, 134 diametrically opposite to each other, and a recess 136 intermediate between the two projections 132, 134. The recess 136 is formed by cutting off a portion of a circular plate such that the cut portion does not contain the center of the circular plate and has a surface area to permit a bottom portion of the stopper block 70 fixed to the piston rod 68 to pass therethrough so as to abut on the end face 130 of the base member 116.

As shown in FIG. 10, the rotary member 120 fixed to the cartridge frame 40 has such a thickness that an end face 138 thereof on the side of the air cylinder 66 defines a limit of the advancing movement of the piston rod 68 which corresponds to the second greatest one of the tape feeding pitches available on the cartridge 10. The first and second stopper projections 132, 134 have a first and a second length or height which defines the third greatest tape feeding pitch and the smallest tape feeding pitch available on the cartridge 10, respectively.

By loosening the bolt 118, the rotary member 120 is made rotatable relative to the base member 116. Thus, the rotary member 120 can be rotated and adjusted such that one of the first and second stoppers 132, 134, the end face 138 of the rotary member 120, and the end face 130 of the base member 116 faces the stopper block 70 fixed to the piston rod 68, as shown in FIGS. 6 and 8 to 10. Thus, the rotary member 120 and the base member 116 cooperate with each other to define four rotation-limiting positions which correspond to the four limits of backward-direction rotation of the rotary plate 72, respectively. When each of the first and second stoppers 132, 134 and end face 138 of the rotary member 120 is faced toward the stopper block 70, each portion 132, 134, 138 of the rotary member 120 is held in close contact with the base member 116, so that each portion 132, 134, 138 is supported by the base member 116.

Figure 8:
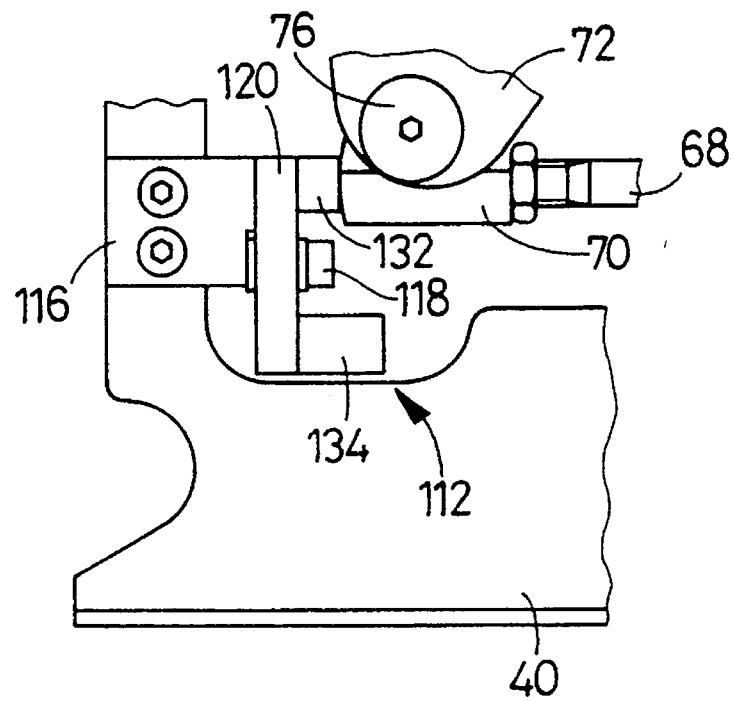
FIG. 8 is a front view of the rotary member of FIG. 7 which takes an angular phase different from an angular phase thereof shown in FIG. 6 and defines a corresponding limit of backward movement of the rotary plate shown in FIG. 6.
Figure 9:
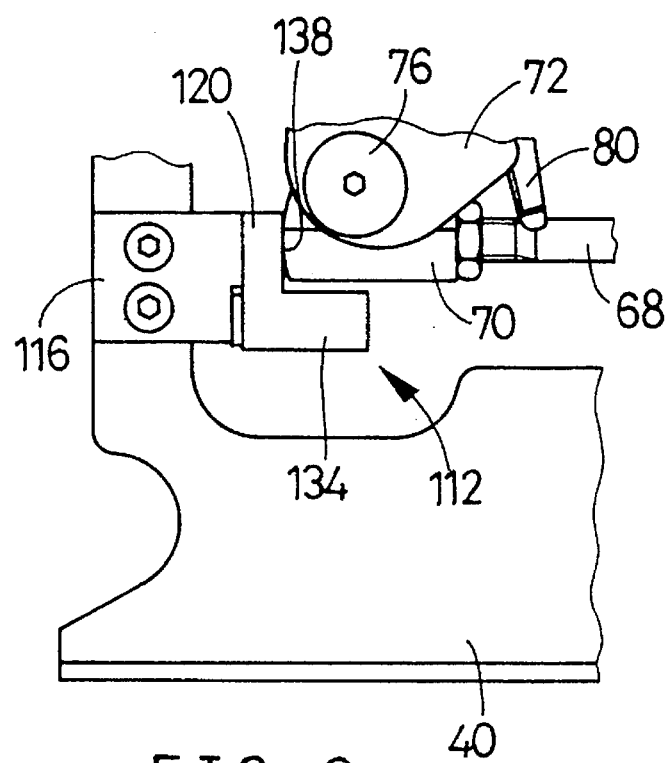
FIG. 9 is a front view of the rotary member of FIG. 7 which takes an angular phase different from the angular phases thereof shown in FIGS. 6 and 8 and defines a different limit of backward movement of the rotary plate shown in FIG. 6.

In the case where one of the two stopper projections 132, 134 is faced toward the stopper block 70, as shown in FIGS. 6 and 8, the stopper block 70 is abutable on the stopper projection 132, 134 to limit the backward-direction rotation of the rotary plate 72. In the case where the end face 138 of the rotary member 120 is faced toward the stopper block 70, as shown in FIG. 9, the stopper block 70 is abutable on the end face 138 to limit the backward rotation of the rotary plate 72. In the case where the end face 130 of the base member 116 is exposed and faced toward the stopper block 70, as shown in FIG. 10, the stopper block 70 is abutable, via the recess 136, on the end face 130 to limit the backward rotation of the rotary plate 72. It can be said that when one of the two stoppers 132, 134 and end face 138 of the rotary member 120 is faced to the stopper block 70, the rotary member 120 is in an operative or advanced position thereof and that when the end face 130 of the base member 116 is faced toward the stopper block 70, the rotary member 120 is in an inoperative or retracted position thereof and the base member 116 is in an operative position thereof.

Figure 3:
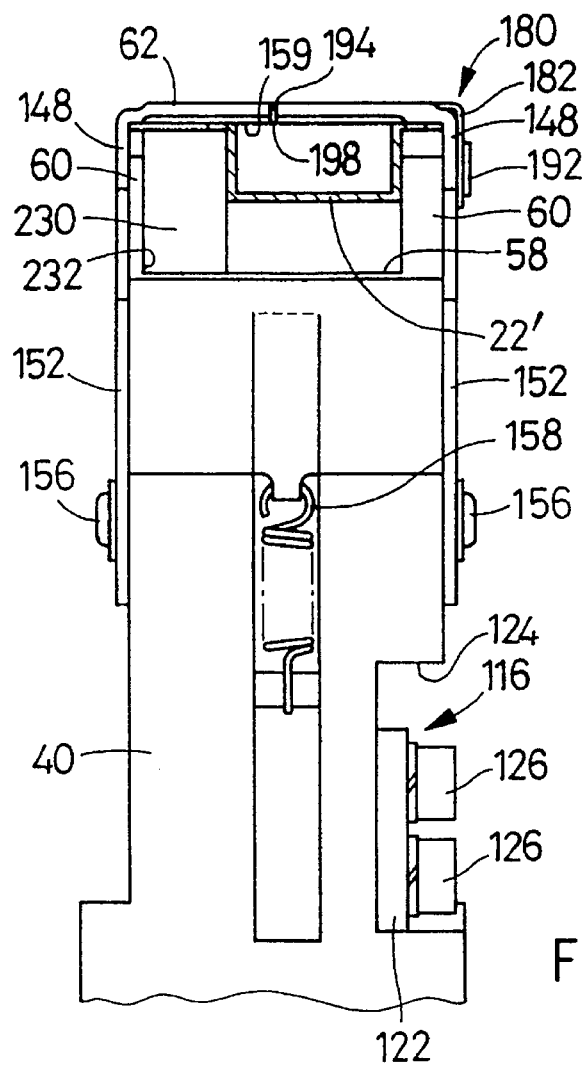
FIG. 3 is a side view, partly in cross section, of a cartridge frame of the cartridge of FIG. 1 to which a spacing adjusting block is attached.
Figure 12:
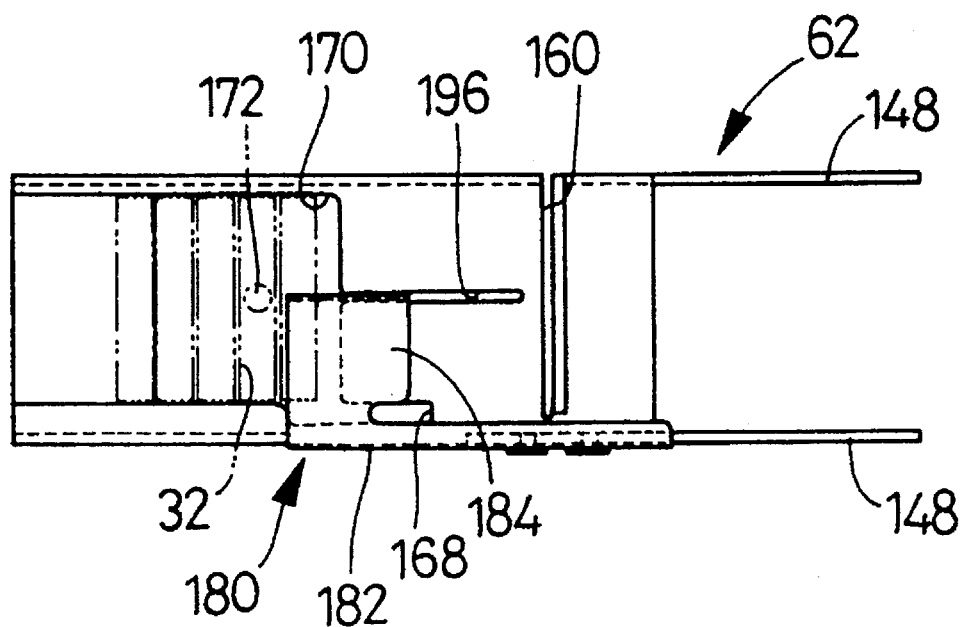
FIG. 12 is a plan view of a cover member and a shutter of the cartridge shown in FIG. 11.

As shown in FIGS. 5 and 12, the cover member 62 has a generally U-shaped cross section, and is pivotally attached at a rear end portion thereof to the cartridge frame 40 via a sixth axis member 146 (FIG. 6). As shown in FIG. 3, the cover member 62 includes a pair of side plates 148, 148. As shown in FIG. 6, the two side plates 148, 148 have respective engaging recesses 150, 150 with which a pair of engaging members 152, 152 attached to the cartridge frame 40 are engaged, respectively. Each engaging member 152 has a vertically elongate hole 154, and fits on a pin 156 fixed to a side face of the frame 40 such that the engaging member 152 is movable relative to the frame 40. The engaging members 152, 152 are biased downward by a spring 158. Thus, the two engaging members 152, 152 are engaged with the cover member 62 such that the former 152, 152 cannot be disengaged from the latter 62. In addition, the engaging members 152, 152 biases the cover member 62 downward so that a bottom surface 159 of the cover member 62 contacts an upper surface of the carrier tape 22 and thereby prevents the components 20 from jumping out of the pockets 30, as shown in FIG. 3. The bottom surface 159 of the cover member 62 provides a fixed surface for preventing the jumping of the electronic components 20.

As shown in FIG. 12, the cover member 62 has a slit 160 extending perpendicular to the tape feeding direction. As shown in FIG. 2, the cover film 26 removed from the EC accommodating tape 24 is drawn through the slit 160, subsequently is guided by a guide roller 164 fixedly supported by the cartridge frame 40, and then is taken up by a take-up reel 162 as a part of the film taking-up device 16 which will be described later.

The cover member 62 has an elongate hole 168 formed in a portion thereof corresponding to the perforations 34 of the carrier tape 22. The provision of the elongate hole 168 ensures that the teeth 92 of the sprocket 90 do not interfere with the cover member 62. A generally rectangular opening 170 is formed in a portion of the cover member 62 which portion is nearer to a front end of the same 62 than the slit 60. A suction head or nozzle 172 picks up each component 20 from the carrier tape 22 through the opening 170. The opening 170 has such dimensions which permit the electronic components 20 to be picked up therethrough by the suction head 172.

The suction head 172 is mounted on an X-direction movable device (not shown) such that the head 172 can be moved upward and downward by an elevating device (not shown). The suction head 172 is moved by the X-direction movable device, in an X direction which orthogonally intersects a Y direction as the tape feeding direction in the horizontal plane. A number of EC supplying cartridges 10 each in accordance with the present invention are mounted on a support table (not shown) such that the respective EC picking-up positions thereof are aligned with a reference straight line parallel to the X direction. The suction head 172 is movable in the X direction, along the reference line, i.e., such that the position of the head 172 with respect to the Y direction is not changed from the reference line. Thus, the suction head 172 can pick up electronic components 20 from each of the cartridges 10.

The opening 170 of the cover member 62 can partly be covered by a shutter 180, or can completely be uncovered. As shown in FIG. 5, the shutter 180 includes a plate-like slide portion 182 and an EC-jumping preventing portion 184. The slide portion 182 fits between the rotary plate 72 and the ratchet wheel 86, and extends in the tape feeding direction. The preventing portion 184 extends from a top end of the slide portion 182 onto the cover member 62.

As shown in FIGS. 5 and 6, a recess 186 is formed in a front portion of the slide portion 182. The recess 186 extends vertically and opens downward. A projection 188 provided on the rotary plate 72 fits in the recess 186. When the rotary plate 72 is rotated forward or backward, the shutter 180 is advanced or retracted in the tape feeding direction. An elongate hole 190 is formed in a central to a rear portion of the slide portion 182. The elongate hole 190 extends parallel to the tape feeding direction. Stepped pins 192 each including a head portion and a stepped axis portion are inserted to the elongate hole 190 such that the stepped axis portion of each pin 192 extends through the hole 190. A small-diameter portion of the stepped axis portion of each pin 192 is caulked and fixed to one of the side plates 148 of the cover plate 62. A large-diameter portion of the stepped axis portion of each pin 192 is movable relative to the elongate hole 190 in the tape feeding direction. The elongate hole 190 and the respective large-diameter portions of the stepped axis portions of the two pins 192 cooperate with each other to provide a shuttle guiding device for guiding the shutter 180 in a direction parallel to the tape feeding direction.

The EC-jumping preventing portion 184 of the shutter 180 has such a length which ensures that a rear portion of the preventing portion 184 overlaps a front portion of the cover member 62 even when the shuttle 184 is advanced over a maximum distance. As shown in FIGS. 5 and 12, the preventing portion 184 extends from the slide portion 182 to a central position between the pair of rails 60, 60 where the portion 184 extends downward as an EC-jumping preventing tongue 194. The cover member 62 has a slit 196 which is formed upstream of the opening 170 as seen in the tape feeding direction, extends parallel to the feeding direction, and communicates with the opening 170. Thus, the cover member 62 does not interfere with the preventing tongue 194 which fits in the slit 196 such that the tongue 194 is movable relative to the cover member 62. A bottom surface 198 of the tongue 194 is flush with the fixed EC-jumping preventing surface 159 of the cover member 62. Thus, the bottom surface 198 of the tongue 194 defines a movable EC-jumping preventing surface.

As shown in FIG. 1, the film taking-up device 16 is provided between the tape-reel holding device 12 and the tape feeding device 14. When the carrier tape 22 is fed by the feeding device 14, the taking-up device 16 takes up the cover film 26 from the carrier tape 22. As shown in FIG. 2, the taking-up device 16 includes a take-up reel 162 which has a cylindrical drum 202 and a pair of flanges 204, 204 extending radially outwardly from opposite axial ends of the drum 202, respectively. The drum 202 is engaged, via a friction-engagement member such as a rubber ring, with a reel supporting member (not shown) which is rotatably supported on a seventh axis member 206.

The seventh axis member 206 is attached to a support member 210 as a part of the cartridge frame 40. A take-up lever 214 is rotatably attached to the axis member 206. The take-up lever 214 has a triangular shape. As shown in FIG. 2, the lever 214 is biased by a tension coil spring 216 that is an elastic member as a biasing device, in a direction to take up the cover film 26. The coil spring 216 is provided between the lever 214 and the support member 210.

The take-up lever 214 has an arcuate elongate hole 218 whose center rides on an axis line of the seventh axis member 206. An engagement member 222 which rotatably fits on an axis member fixed to one of two end portions of a link 220, is engaged with the elongate hole 218 such that the engagement member 222 is movable relative to the lever 214. The other end portion of the link 220 is connected to the rotary plate 72 and the stopper block 70 via the fourth axis member 76. More specifically, the link 220 fits on the axis member 76 such that the link 220 is rotatable relative to the plate 72 and the block 70. A knob 224 is formed in an intermediate portion of the link 220. The knob 224 can be used by an operator for manually moving the link 220.

A first one-way clutch (not shown) is provided between the reel supporting member (not shown) which supports the take-up reel 162, and the take-up lever 214. The first one-way clutch inhibits the lever 214 from being rotated relative to the reel 162 in a first direction in which to take up the cover film 26, but permits the lever 214 to be rotated relative to the reel 162 in a second direction opposite to the first direction. A second one-way clutch (not shown) is provided between the reel supporting member and the seventh axis member 206. The second one-way clutch permits the reel 162 to be rotated relative to the axis member 206 in the first direction in which to take up the cover film 26, but inhibits the reel 162 from being rotated relative to the axis member 206 in the second direction opposite to the first direction.

As described above, the drum 202 of the reel 162 is friction-engaged with the reel supporting member, and the rotation of the reel supporting member in the second direction opposite to the first, film-taking-up direction is inhibited by the second one-way clutch. Therefore, if a rotation torque which overcomes the friction resistance produced between the reel 162 and the reel supporting member is applied to the reel 162, the reel 162 can be rotated relative to the reel supporting member in the direction opposite to the film-taking-up direction. Thus, the take-up reel 162 can easily be attached to, and detached from, the reel supporting member. In addition, an appropriate length of the cover film 26 which has been wound around the drum 202 of the reel 162 can easily be re-wound so as to again cover the openings 32 of the pockets 30, so that the components 20 covered with the film 26 are supplied to the suction head 172.

The carrier tape 22 wound around the tape reel 38 is drawn from the reel 38 by the operator, and subsequently the tape 22 is engaged with a bottom portion of an outer circumferential surface of the drum 202 of the take-up reel 162. Then, the pair of side portions 28, 28 of the carrier tape 22 are placed on the pair of rails 60, 60 provided on the cartridge frame 40, and the perforations 34 of the tape 22 are engaged with the teeth 92 of the sprocket 90.

The take-up reel 162 is attached to the cartridge frame 40 such that a straight line connecting the tape reel 38 and the rails 60, 60 intersects the bottom portion of the outer circumferential surface of the drum 202, so that a tape supply route from the reel 38 to the rails 60, 60 is changed or curved by the bottom portion of the drum 202. Accordingly the carrier tape 22 is engageable with the bottom portion of the drum 202. As the carrier tape 22 is fed, i.e., as the electronic components 20 are supplied, the diameter of the tape 22 wound around the tape reel 38 decreases and the diameter of the cover film 26 wound around the drum 202 of the take-up reel 162 increases. Irrespective of the decreasing of the diameter of the tape 22 wound around the tape reel 38 or the increasing of the diameter of the film 26 wound around the take-up reel 162, the outer circumferential surface of the drum 202 or the cover film 26 wound around the drum 202 partly defines the tape supply route between the tape reel 38 and the rails 60, 60. In other words, the outer circumferential surface of the drum 202 or the cover film 26 wound around the drum 202 provides a guide roller for guiding the tape 22 being fed from the reel 38 to the rails 60, 60. The direction of feeding of the tape 22 from the reel 38 to the rails 60, 60 via the bottom portion of the drum 202 is the same as the direction of movement of the bottom portion of the drum 202 when the drum 202 is rotated about the seventh axis member 206.

As described previously, the attachment position where the tape reel 38 is attached to the rear end portion 44 of the cartridge frame 40 is changeable depending upon the diameter of the tape reel 38 to be used, so that the rotation of the reel 38 is resisted by the resisting member 46. The changing of the attachment position ensures that the carrier tape 22 is engaged with the bottom portion of the drum 202 or the cover film 26 wound around the drum 202.

However, it is possible that the take-up reel 162 be attached to the cartridge frame 40 in such a manner that a straight line connecting the tape reel 38 and the rails 60, 60 does not intersect any portion of the outer circumferential surface of the drum 202, i.e. is completely distant from the drum 202 even after the cover film 26 is fully wound around the drum 202. In the latter manner, the tape 22 is engaged with a portion of the drum 202 which is the most distant from the straight line, such that the direction of feeding of the tape 22 from the reel 38 to the rails 60, 60 via the most distant portion of the drum 202 is the same as the direction of movement of the most distant portion of the drum 202 when the drum 202 is rotated about the seventh axis member 206.

Figure 4:
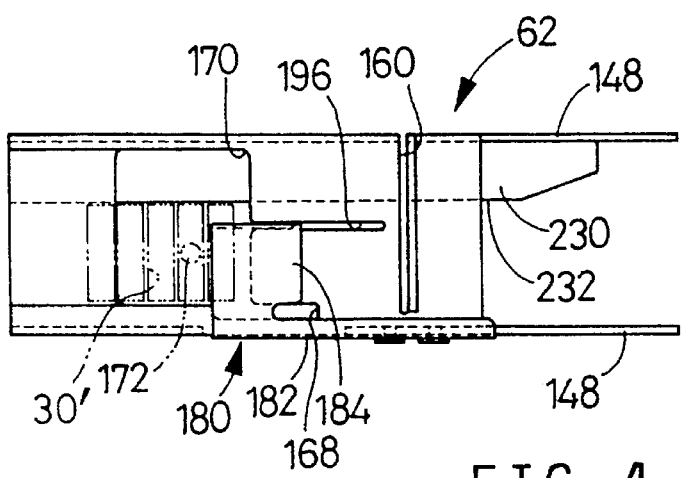
FIG. 4 is a plan view of a cover member, a shutter, and the spacing adjusting block of the cartridge of FIG. 1.

The present EC-supplying cartridge 10 can supply two sorts of carrier tapes 22, 22' including different EC-accommodating tapes 24, 24' having different widths, respectively. One 22 of the two carrier tapes 22, 22' is fed on the pair of rails 60, 60 formed integrally with the cartridge frame 40, such that the side portions 28, 28 thereof are supported by the rails 60, 60, respectively. The other or second carrier tape 22' has a width, i.e., a distance between a pair of side portions thereof which is smaller than that of the side portions 28, 28 of the first carrier tape 22. As shown in FIGS. 3 and 4, the second tape 22' is fed on one of the rails 60, 60 and a rail-spacing adjusting block 230.

The spacing adjusting block 230 has the same height as that of the rails 60, 60 as measured from the top surface 58 of the cartridge frame 40. The block 230 is placed on the top surface 58 such that the block 230 is held in close contact with an inner side surface 232 of one of the rails 60, 60 which is opposite to the other rail 60 on the side of which the sprocket 90 and the ratchet wheel 86 are provided. The block 230 is removably secured to the frame 40 with a plurality of bolts (not shown). An upper surface of the block 230 is flush with an upper surface of the other rail 60. Thus, the block 230 cooperates with the other rail 60 to provide a pair of rails on which the tape 22' is fed toward the EC taking-up position.

When the spacing adjusting block 230 is attached to, or detached from, the cartridge frame 40, the cover member 62 is retracted away from the frame 40. More specifically described, with the engaging recess 150 of the cover member 62 being disengaged from the engaging member 152, the cover member 62 is pivoted and retracted from the frame 40. Simultaneously, the shutter 180 which is attached to the cover member 62 via the elongate hole 190 and the stepped pins 192, 192 is retracted from the frame 40 together with the cover member 62. The shutter 180 is engaged with the rotary plate 72 via the recess 186 and projection 188 engaged with each other, but the position of engagement of the recess 186 and projection 188 is distant from the sixth axis member 146 about which the cover member 62 rotates. Therefore, when the cover member 62 is pivoted about the axis member 146, the recess 186 is moved substantially vertically, so that the recess 186 can be disengaged from the projection 188 of the rotary plate 72.

Next, there will be described the operation of the EC supplying cartridge 10 constructed as described above.

Prior to the commencement of supplying of the carrier tape 22, 22', the spacing adjusting member 230 is attached to, or detached from, the cartridge frame 40, as needed, depending upon the predetermined width or distance of the side portions 28, 28 of the tape 22 or the side portions of the tape 22'. In addition, the limit of backward-direction rotation of the rotary plate 72 is changed depending upon the predetermined feeding pitch of the tape 22, 22'.

In the case where the carrier tape 22 having the greater width is supplied, the side portions 28, 28 of the tape 22 are fed on the pair of rails 60, 60, respectively, as shown in FIGS. 11 and 12. In this case, respective outer side ends of the side portions 28, 28 are held in close contact with respective inner surfaces of the side plates 148, 148 of the cover plate 62, with substantially no clearances therebetween. Thus, the position of the carrier tape 22 with respect to the widthwise or lateral direction thereof in which the side portions 28, 28 are spaced from each other, is defined by the close contact of the side portions 28, 28 with the side plates 148, 148. The position of the tape 22 with respect to the longitudinal direction thereof, i.e., in the tape feeding direction is defined by the engagement of the teeth 92 of the sprocket 90 with the perforations 34 of the tape 22. FIG. 12 shows pockets 30 having openings 32 whose width in the lateral direction is a maximum and whose length in the feeding direction is a minimum corresponding to the maximum width. Therefore, the cartridge 10 can supply different carrier tapes whose pockets or openings have greater lengths than shown in FIG. 12. This is also the case with pockets 30' or openings of the carrier tape 22' shown in FIG. 4.

In the case where the carrier tape 22' having the smaller width, the tape 22' is fed on one of the rails 60 and the spacing adjusting block 230, as shown in FIGS. 3 and 4. In this case, only one of the side portions 28', 28' of the tape 22' in which perforations are formed is held in close contact with a corresponding one of the side plates 148, 148 of the cover member 62, with substantially no clearance therebetween. In this case, the positioning of the tape 22' with respect to the lateral direction thereof is defined by the contact of the one side portion with the one side plate 148. The positioning of the tape 22' with respect to the tape feeding direction is defined by the engagement of the teeth 92 of the sprocket 90 with the perforations of the tape 22'. Thus, a portion of the tape 22' which is engaged with the teeth 92 of the sprocket 90 is well positioned in the horizontal plane. That is, the cover member 62 prevents the tape 22' from being rotated about the above-mentioned engaged portion thereof in the horizontal plane. Thus, the tape 22' is positioned with respect to both the lengthwise and widthwise directions thereof.

The opening 170 of the cover member 62 has such dimensions which permit large components 20 to be picked up therethrough by the suction nozzle 172. Small components 20 have such dimensions which ensure that the shutter 180 prevents the jumping of the components 20 out of the carrier tape 22', as shown in FIG. 4. Therefore, even if the tapes 22, 22' are changed with each other and the spacing adjusting block 230 is attached to or detached from the cartridge frame 40, the cover member 62 or the shutter 180 is not changed. Components 20 having different dimensions are accommodated in pockets 30, 30' having different dimensions. However, irrespective of the dimensions of the components 20, the pockets 30, 30' are provided with a constant distance from the perforations 34 formed in one side portion 28 of the carrier tape 22, 22'. Accordingly, if the tapes 22, 22' are changed with each other, the respective centers of the pockets 30, 30' or components 20 accommodated in the pockets are moved with respect to the lateral direction of the tape 22, 22'. Therefore, the EC picking-up position where the suction nozzle 172 picks up by air suction each component 20 from the tape 22, 22' should be moved or adjusted in the X direction, depending upon the width of the tape 22, 22' or the dimensions of the components 20, so that the suction nozzle 172 can apply air suction or vacuum to the center of each component 20.

When the feeding pitch of the carrier tape 22, 22' is changed, the limit of backward-direction rotation of the rotary plate 72 is changed to a new one. With the bolt 118 being loosened, the rotary member 120 is rotated, so that a desired one of the two stopper projections 132, 134, the end face 138 of the rotary member 120, or the end face 130 of the attachment member 116 is faced toward the stopper block 70 fixed to the piston rod 68 of the air cylinder 66. The desired one 132, 134, 138, 130 corresponds to the changed or new feeding pitch of the tape 22, 22'. After the rotary member 120 is thus rotated, the bolt 118 is fastened again so that the rotary member 120 is secured to the attachment member 116.

As the piston rod 68 of the air cylinder 66 is extended or advanced, the stopper block 70 fixed to the rod 68 is brought into abutment on one of the two stoppers 132, 134 and the two end faces 138, 130, thereby limiting the backward-direction rotation of the rotary plate 72. In this situation, the ratchet pawl 80 has moved over a predetermined number of teeth 82 of the ratchet wheel 86, and the shutter 180 is held at the retracted position thereof.

When the piston rod 68 is withdrawn from the advanced position thereof, the rotary plate 72 is rotated in the forward direction thereof, so that the shutter 180 is advanced in the tape feeding direction and the ratchet wheel 86 and the sprocket 90 are rotated in the forward directions thereof. Thus, the carrier tape 22, 22' is fed by a distance corresponding to one pitch. That is, the leading one of the electronic components 20 from which the cover film 26 has been removed is fed to the EC picking-up position while simultaneously the jumping of the leading component 20 from the tape 22, 22' is effectively prevented by the movable jumping-preventing tongue 194 of the shutter 180.

Since the shutter 180 has a sufficient length which ensures that the rear end portion of the shutter 180, moved to the advanced position thereof, overlaps the cover member 62, the components 20 accommodated in the pockets 30, 30' from which the cover film 26 has been removed are effectively prevented from jumping out of the pockets 30, 30', by the immovable jumping-preventing surface 159 of the cover member 62 or the movable jumping-preventing surface 198 of the shutter 180, before each component 20 is picked up by the suction head 172.

Subsequently, the piston rod 68 is advanced, and the rotary plate 72 is rotated in the backward direction thereof. However, the ratchet wheel 86 is not rotated, so that the carrier tape 22, 22' is not fed. Only the shutter 180 is moved in the feeding direction, from the advanced position thereof to the retracted position thereof, so that the movable jumping-preventing tongue 194 is retracted away from the leading component 20 positioned at the EC picking-up position just below the suction nozzle 172.

In synchronism with the movement of the shutter 180 from the advanced position thereof to the retracted position thereof, the suction nozzle 172 held at the EC picking-up position is lowered in such a manner that the suction nozzle 172 is brought into contact with the leading component 20 just after the movable jumping-preventing tongue 194 is completely retracted away from the leading component 20. Thus, the suction nozzle 172 picks up by air suction the leading component 20. The suction nozzle 172 holding the component 20 is lifted upward and subsequently moved in the X direction, so that the suction nozzle 172 mounts the component 20 on an object such as a printed circuit board (PCB).

When the ratchet pawl 80 is moved over the teeth 88 of the ratchet wheel 86 as a result of the extension or advancing movement of the piston rod 68, the link 220 is advanced forward, so that the take-up lever 214 is rotated, against the biasing force of the tension coil spring 216, in a backward direction thereof opposite to a forward direction thereof in which to take up the cover film 26 removed from the carrier tape 22, 22'. In this case, however, the rotary motion of the lever 214 is not transmitted, by the first one-way clutch (not shown), to the reel supporting member (not shown) or the take-up reel 162, and the rotation of the reel supporting member or the take-up reel 162 is prevented by the second one-way clutch.

When the carrier tape 22, 22' is fed by the retraction of the piston rod 68, the link 220 is retracted so that the take-up lever 214 is biased by the tension coil spring 216 so as to be rotated in the forward direction thereof, i.e., cover-film taking-up direction. This rotation of the lever 214 is transmitted by the first one-way clutch to the reel supporting member and the take-up reel 162 whose rotations are permitted by the second one-way clutch, so that the cover film 26 is removed from the carrier tape 22, 22' and is taken up around the reel 162. As the amount of winding of the film 26 around the reel 162 increases, the diameter of the film 26 wound around the drum 202 of the reel 162 increases and, accordingly, the amount of winding of the film 26 around the reel 162, per unit rotation angle of the same 162, increases. However, any excessive rotation angle or amount of the reel 162 is accommodated by the movement of the engagement member 222 within the elongate hole 218 relative to the lever 214, i.e., the disengagement of the link 220 from the lever 214. In other words, as the diameter of the film 26 wound around the drum 202 increases, the angle of rotation of the reel 162 for each film winding decreases, so that a length of the film 26 equal to the tape feeding pitch is taken up for each film winding, irrespective of the increased diameter of the film 26. The amount of deformation of the biasing spring 216 is kept substantially constant.

The slit 160 of the cover member 62 through which the cover film 26 is drawn is positioned outside the range in which the shutter 180 is advanced and retracted. Therefore, the film 26 is not interfered with by the shutter 180 when the shutter 180 is moved. Only when the shutter 180 is advanced and the carrier tape 22, 22' is fed forward, the film 26 is removed from the tape 22, 22', drawn through the slit 160, and taken up by the take-up reel 162.

Thus, the winding direction and winding timing of the cover film 26 correspond to the feeding direction and feeding timing of the carrier tape 22, 22', respectively. The tape 22, 22' engaged with the outer circumferential surface of the drum 202 or the film 26 wound around the drum 202, is guided and fed by the drum 202 or the film 26 wound around the drum 202. Since an adhesive used to adhere the film 26 to the EC accommodating tape 24 remains on an outer surface of the film 26 wound around the drum 202, a high friction resistance is produced between the film 26 wound around the drum 202 and the carrier tape 22, 22' being fed from the tape reel 38 toward the rails 60, 60 or the rail 60 and block 230. However, a portion of the film 26 being wound around the drum 202 which portion is engaged with the tape 22, 22' being fed is moved in the same direction as the direction of feeding of the tape 22, 22'. Thus, the feeding of the tape 22, 22' is not resisted by the taken-up film 26, but rather is assisted by the taken-up film 26. The film 26 wound around the drum 202 assists the tape feeding device 14 in feeding the tape 22, 22' in the feeding direction.

As described above, even if the diameter of the film 26 wound around the drum 202 increases, the amount of movement of the outer circumferential surface of the wound film 26 as measured in the circumferential direction thereof, in each tape feeding cycle, is equal to the pre-selected or pre-determined tape feeding pitch. Therefore, no sliding occurs between the film 26 taken up around the drum 202 and the carrier tape 22, 22' guided by the taken-up film 26. If, however, the tape 22, 22' is curved due to the weights of the components 20, between the tape reel 38 and the rails 60, 60 or the one rail 60 and the block 230, the film 26 wound around the take-up reel 162 cannot guide the tape 22, 22' or help the tape feeding device 14 to feed the tape 22, 22'.

In the present cartridge 10, the rotary member 120 is attached to the cartridge frame 40 via the attachment member 116, such that the rotary member 120 is rotatable about an axis line parallel to the direction of movement of the stopper block 70. When the block 70 abuts on the rotary member 120 or the attachment member 116, the impact of abutment is exerted in the direction parallel to the axis line of the rotary member 120 and is received by the frame 40 via the two elements 120, 116 or the element 116, so that the impact is assuredly received by the frame 40 and does not result in rotating the rotary member 120. Thus, the rotary member 120 may be produced with low mechanical strength and may be attached to the frame 40 with low attachment strength. Accordingly, the backward-direction stopping device 112 can be produced at low cost.

The rotary member 120 has a sufficient thickness ensuring that the end face 138 thereof functions as a stopper, thereby reducing the number of stopper projections (132, 134) provided thereon. In this respect, too, the backward-direction stopping device 112 can be produced at low cost.

Since the diameter of the rotary member 120 is smaller than the width of the cartridge frame 40, the provision of the rotary member 120 does not result in increasing the width of the frame 40.

It emerges from the foregoing description that in the present embodiment shown in FIGS. 1 to 15, the perforations 34 formed in the carrier tape 22, 22', the sprocket 90, and the cover member 62 cooperate with one another to provide a tape positioning device for positioning the tape 22, 22' with respect to the lateral direction thereof in which the side portions 28, 28 are spaced from each other; the spacing adjusting block 230 functions as a removable rail adjusting member which is removably attached to the cartridge frame 40 and can be used in place of one of the rails 60, 60; and the block 230 and the bolts (not shown) for securing the block 230 to the frame 40 cooperate with each other to provide a rail adjusting device for adjusting the spacing of the two rails (60, 60) or (60, 230) on which the carrier tape 22, 22' is fed.

The air cylinder 66 functions as a drive source of the cartridge 10; the rotary plate 72 functions as a driver member of a tape feeding mechanism; the sprocket 90 and the ratchet wheel 86 cooperate with each other to provide the tape feeding mechanism; the stopper projection 96 functions as a first-direction stopper for defining a first limit of forward-direction movement of the rotary plate 72 as the driver member; the stopper block 70 functions as a first stopper member of a second-direction stopper which is movable together with the rotary plate 72 as the driver member; the rotary member 120 functions as a movable member of the second-direction stopper; the stopper projections 132, 134 and the end faces 138, 130 provide a plurality of second stopper members of the second-direction stopper which are stationary with respect to the frame 40; and the bolt 118 functions as a free-movement preventing device for preventing a free movement or rotation of the rotary member 120 as the movable member relative to the frame 40. The base member 116 functions as an attachment member to which the rotary member 120 as the movable member is secured.

In the present embodiment, the width of the cartridge frame 40 is greater than the diameter of the rotary member 120 as a part of the backward-direction stopping device 112, and the rotary member 120 can be rotated within the frame 40. However, in the case where a carrier tape 22 carrying components 20 each having a small width is supplied by a cartridge 10 having a correspondingly small width, the rotary member 120 may be replaced by a different rotary member which cannot completely be rotated within the small-width cartridge 10, i.e., may be used in such a manner that a portion of the rotary member projects outside of the cartridge frame 40 via an opening or recess formed in the frame 40.

When the small-width components 20 are fed by the small-width cartridge 10 as described above, it is usual that only a few sorts of tape feeding pitches are employed. For example, in the case of three feeding pitches, a rectangular rotary plate may be used in place of the rotary member 120. The rotary plate has, at one end portion thereof, a stopper projection which functions as a first stopper; the other end portion of the rotary plate functions as a second stopper; and an end face of an attachment member to which the rotary plate is attached functions as a third stopper. Each of the first to third stoppers defines a corresponding one of the three limits of backward-direction movement of the drive member 72. When the third stopper is selected, the rotary plate is detached from the attachment member and is kept in a receiver provided in the frame 40. In this case, the single rotary member can define three sorts of tape feeding pitches, although the operator is required to attach or detach the rotary member to or from the attachment member when the feeding pitches are changed.

Figure 16:
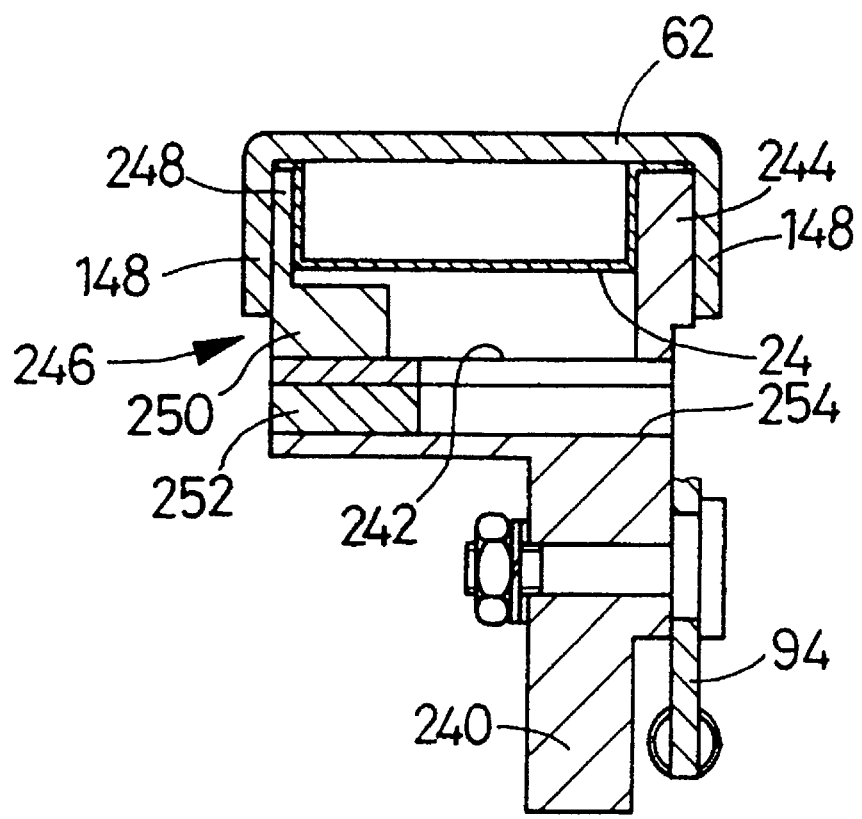
FIG. 16 is a side view, in cross section, of another electronic-component supplying cartridge as a second embodiment of the invention.
Figure 17:
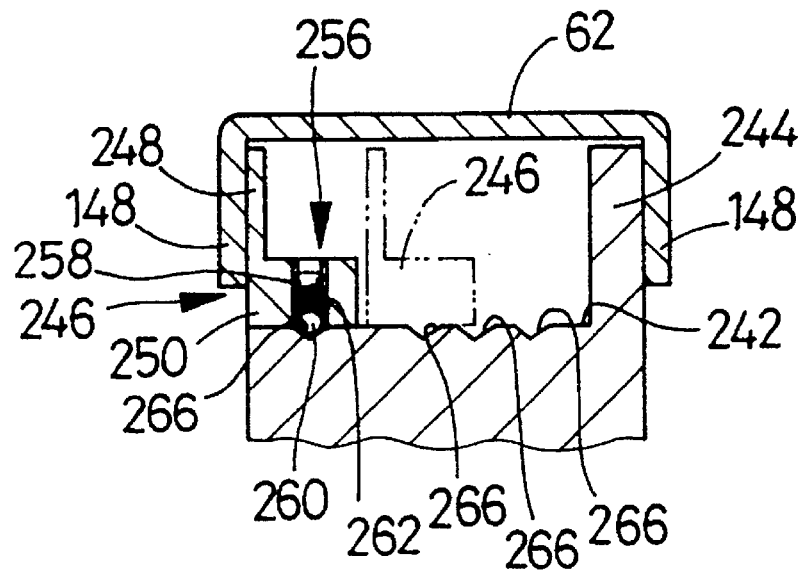
FIG. 17 is a side view, in cross section, of a fixed rail and a movable rail of the cartridge of FIG. 16 in which the movable rail is positioned relative to a cartridge frame.
Figure 18:
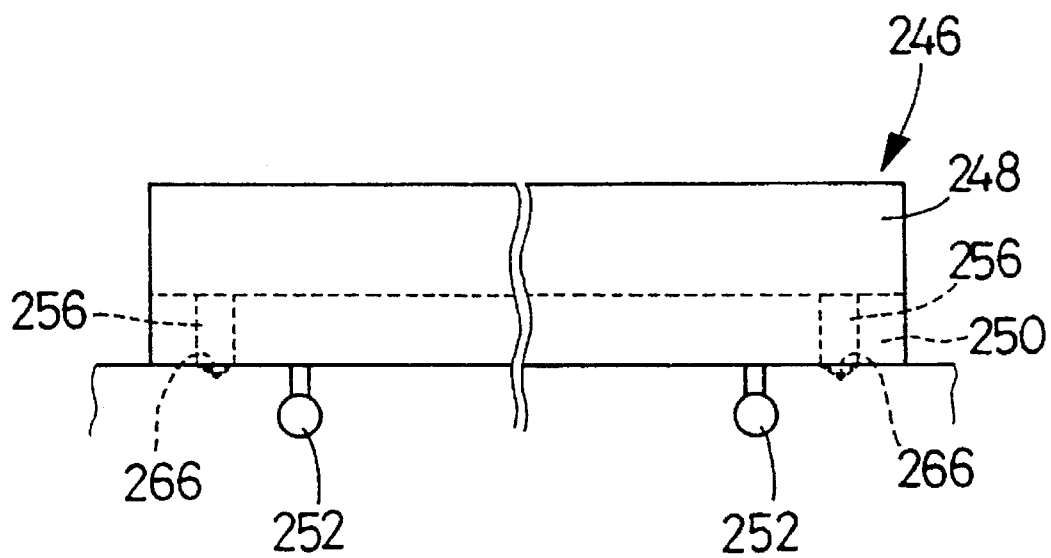
FIG. 18 is a rear view of the movable rail of FIG. 17.

In the present embodiment, the removable spacing adjusting block 230 is used. However, as shown in FIGS. 16 to 18, the pair of fixed rails 60, 60 and the removable spacing adjusting block 230 may be replaced by a fixed rail 244 and a movable rail 246. The same reference numerals as used in FIGS. 1–15 are used to designate the corresponding elements or parts of the second embodiment shown in FIGS. 16 to 18, and the description of those elements or parts is omitted.

As shown in FIG. 16, the fixed rail 244 is provided as an integral part of a cartridge frame 240 with a top surface 242, on the side where the sprocket 90 is provided. The movable rail 246 is provided on the top surface 242, on the other side opposite to the side where the fixed rail 244 is provided. The movable rail 246 is movable or slideable in a lateral direction of the rails 244, 246 in which the two rails 244, 246 are spaced from each other. As shown in FIGS. 16 and 18, the movable rail 246 has an L-shaped cross section and extends in a tape feeding direction in which a carrier tape 22 including an EC-accommodating tape 24 is fed on the two rails 244, 246. The movable rail 246 includes a vertically extending support portion 248 whose top face supports, from underside, one of side portions 28, 28 of the carrier tape 22 or EC-accommodating tape 24.

As shown in FIG. 18, two guide rods 252, 252 are attached to two longitudinally distant locations of a slide portion 250 of the movable rail 246, respectively. The slide portion 250 is slideable on the top surface 242 of the cartridge frame 240. Each guide rods 252 extends in the lateral direction of the rails 244, 246, and slideably fits in a corresponding guide passage 254 formed in the frame 240. Two positioning devices 256, 256 are threadedly engaged with two longitudinally distant locations of the slide portion 250, respectively, outside the two distant locations of the same 250 where the two guide rods 252, 252 are attached. As shown in FIG. 17, each positioning device 256 includes a casing 258 and a ball member 260 which movably fits in the casing 258. A biasing spring biases the ball member 260 in a direction in which to advance the ball member 260 out of the casing 258. The biasing spring 262 is secured to the casing 258 within the slide portion 250.

The top surface 242 of the cartridge frame 240 has two arrays of notches 266 in the lateral direction, at each of two locations of the surface 242 which are distant from each other in the tape feeding direction and correspond to the two positioning devices 256, 256, respectively. Each array of notches 266 includes four notches each having a conical shape as shown in FIGS. 17 and 18. However, the notches 266 may be replaced by four grooves each of which has a V-shaped cross section and extends parallel to the tape feeding direction. The eight notches 266 in total define four different spacings or distances between the fixed rail 244 and the movable rail 246. The movable rail 246 can be positioned relative to the frame 240, in the lateral direction of the rails 244, 246, by the fitting of the ball members 269 in the notches 266 formed in the top face 242.

In order to change or adjust the spacing or distance between the fixed rail 244 and the movable rail rail 246, a force is applied to the movable rail 246 in the lateral direction of the rails 244, 246, i.e., in the widthwise direction of the cartridge frame 240. As a result, the ball members 260 are disengaged from the notches 266 so that the movement of the movable rail 246 is permitted. The ball members 260 can be engaged with the notches 266 at a desired position in the lateral direction, and the movable rail 246 can thus be positioned in the lateral direction.

In the second embodiment shown in FIGS. 16 to 18, the movable rail 246 functions as a movable rail adjusting member; and the positioning devices 256 and the notches 266 cooperates with each other to provide an adjusting-member positioning device. The guide rods 252 function as guided elements, the guide passages 254 function as guiding elements, and the guide rods 252 and the guide passages 254 cooperate with each other to provide a guiding device for guiding the movable rail 246 in the lateral direction. The movable rail 246 as the movable rail adjusting member cooperates with the guide rods and passages 252, 254 as the guiding device to provide a rail adjusting device.

The guided elements and guiding elements of the guiding device are not limited to the guide rods 252 and the guide passages 254 of the illustrated embodiment. For example, engagement grooves or rails extending in the widthwise direction of the cartridge frame 240 may be formed in the top surface 242 of the frame 240, and engagement rails or grooves engageable with the engagement grooves or rails of the frame 240 may be formed in a bottom surface of the slide portion 250 of the movable rail member 246. In the latter case, the grooves or rails of the frame 240 and the rails or grooves of the slide portion 250 cooperate with each other to provide the guiding and guided elements of the guiding device.

In each of the first and second embodiments, the single rail-spacing adjusting block 230 or the single movable rail 246 is employed as a rail adjusting member. However, a pair of rail adjusting members may be employed. For example, a pair of removable rail-spacing adjusting members may be used in such a way that the two removable rail-spacing adjusting members, preferably each having the same width, are secured to the cartridge frame 40 by being held in close contact with respective inner side surfaces of the rails 60, 60.

Figure 19:
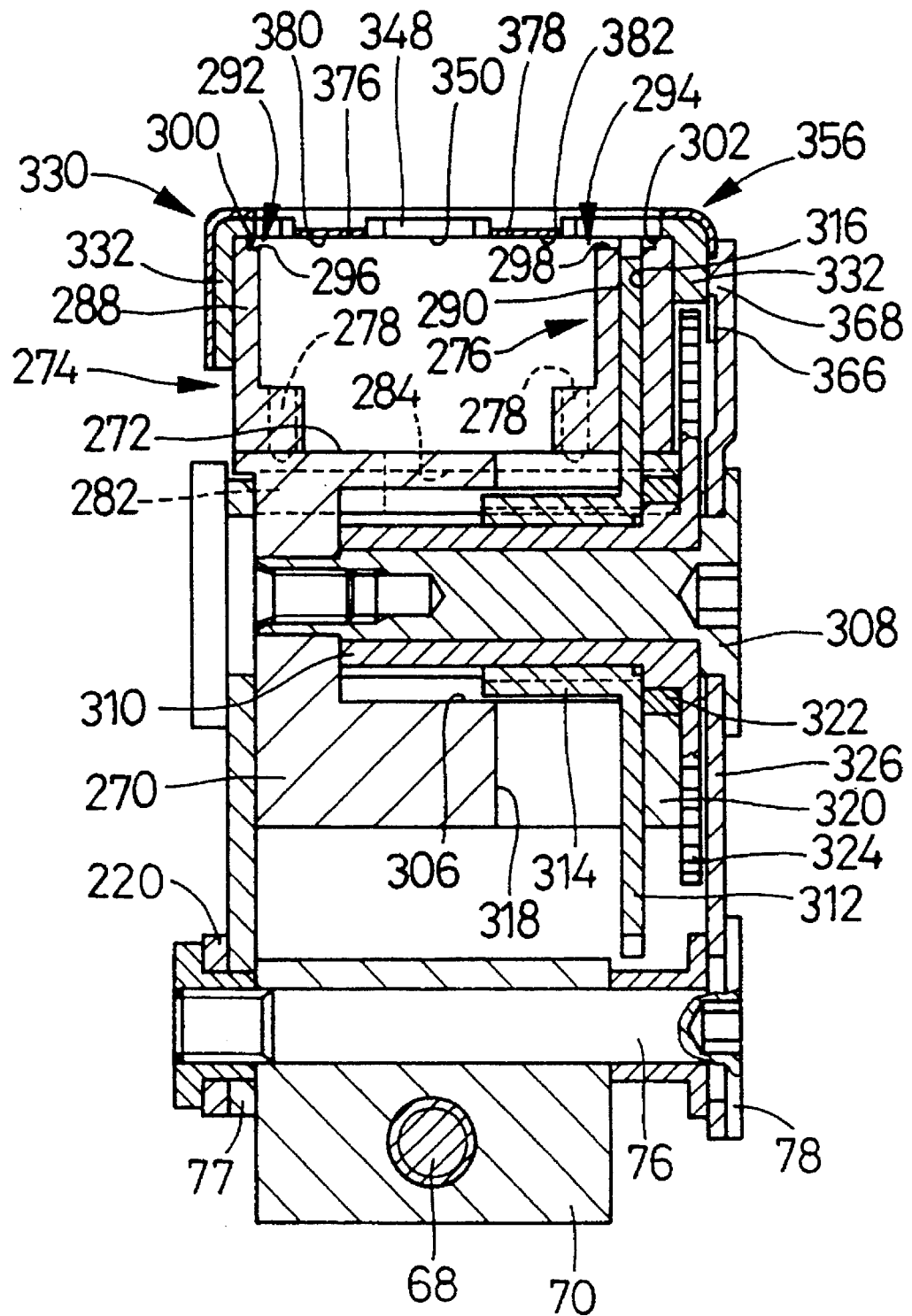
FIG. 19 is a view corresponding to FIG. 5, showing another electronic-component supplying cartridge as a third embodiment of the invention.
Figure 20:
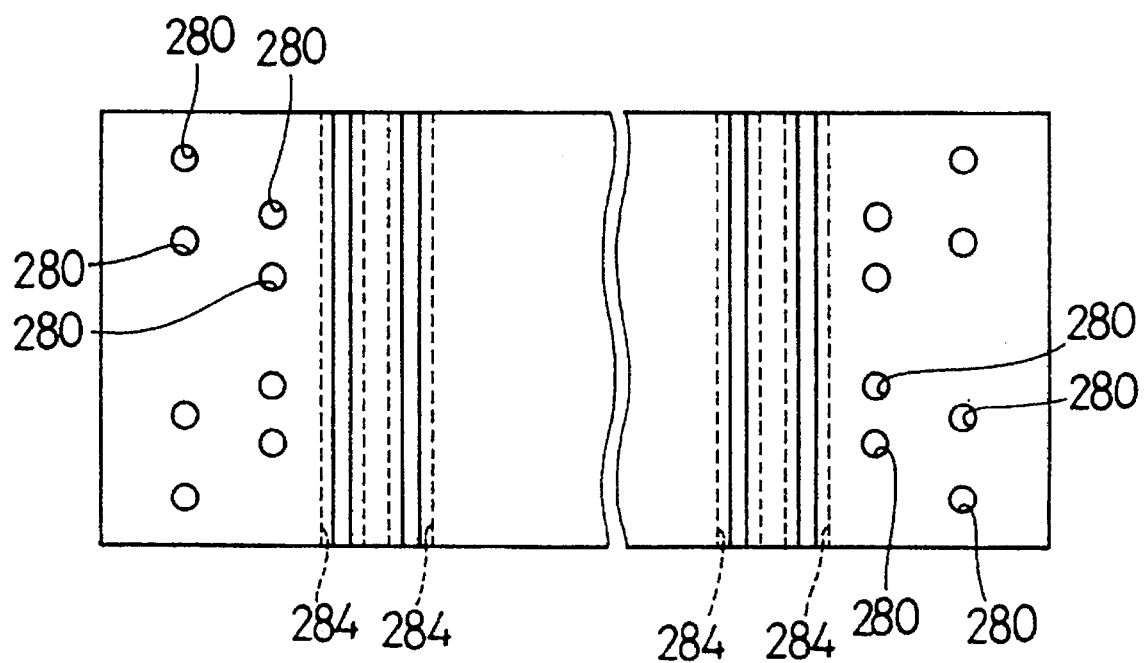
FIG. 20 is a plan view of a cartridge frame of the cartridge of FIG. 19.

Referring next to FIGS. 19 to 22, there will be described a third embodiment of the invention wherein a pair of movable rails 274, 276 are employed as two rail adjusting members. FIG. 19, corresponding to FIG. 5, shows that the two movable rails 274, 276 are provided on a top surface 272 of a cartridge frame 270 such that each rail 274, 276 is movable or slideable in a widthwise direction of the frame 270, i.e., in a lateral direction of the rails 274, 276. Similar to the second embodiment shown in FIGS. 16 to 18, each of the movable rails 274, 276 is positioned in the lateral direction by an adjusting-member positioning device including positioning devices 278 and notches 280 (FIG. 20), and is guided by a guiding device including guide rods 282 and guide passages 284 (FIG. 20).

As shown in FIG. 20, notches 280 are formed in four groups, and each group includes four notches 280 arranged in a double-staggered fashion. Two and the other two notches 280 of each notch group are formed at different positions in a tape feeding direction perpendicular to the lateral direction, and the two notches 280 formed at each position in the tape feeding direction are formed at different positions in the lateral direction. This arrangement is for avoiding the overlapping of notches 28 adjacent to each other. In the case where the size of the notches 280 is sufficiently smaller than the distance of the notches 280, the double-staggered fashion need not be employed.

Each movable rail 274, 276 has an L-shaped cross section and extends in the tape feeding direction. The rails 274, 276 respectively include vertically extending support portions 288, 290 which have a height equal to the thickness of a carrier tape 22 or an EC-accommodating tape 24 and which respectively have recesses 292, 294 extending parallel to the tape feeding direction and respectively having bottom surfaces 296, 298. The carrier tape 22 is fed on the rails 274, 276 such that two side portions 28, 28 of the tape 22 are supported from underside by the bottom surfaces 296, 298 of the support portions 288, 290, respectively. The recesses 296, 298 respectively have guide surfaces 300, 302 which have a height equal to the thickness of the side portions 28, 28 of the tape 22 and respectively guide the side portions 28, 28 in the tape feeding direction.

The cartridge frame 270 has a stepped hole 306 which opens in one of major side surfaces of the frame 270 and extends in the widthwise direction of the frame 270. An axis member 308 is secured to a bottom wall of the stepped hole 308 such that the axis member 308 is coaxial with the hole 308. A first spline sleeve 310 having splines formed in an outer circumferential surface thereof fits on the axis member 308 such that the sleeve 310 is rotatable relative to the axis member 308. A second spline sleeve 314 formed integrally with a sprocket 312 and having splines in an inner circumferential surface thereof, fits on the first spline sleeve 310. The sprocket 312 fits in a recess 316 formed in one 276 of the movable rails 274, 276, such that the sprocket 312 is rotatable relative to the movable rail 276 but immovable relative to the same 276 both in the tape feeding direction and the lateral direction. When the movable rail 276 is moved in the lateral direction, the sprocket 312 is moved together with the rail 276. A recess 318 is formed for avoiding the interference of the cartridge frame 270 with the lateral-direction movement of the sprocket 312.

An opening of the stepped hole 306 is closed by a lid member 320 which is fixed to the cartridge frame 270. The first spline sleeve 310 is supported by a ring member 322 press-fit in the lid member 320, such that the sleeve 310 is rotatable relative to the lid member 320. A ratchet wheel 324 is formed integrally with an axially end portion of the first spline sleeve 310 which extends outward of the lid member 320. A rotary plate 326 is rotatably attached to an axially end portion of the axis member 308 which extends outwardly of the ratchet wheel 324.

Figure 22:
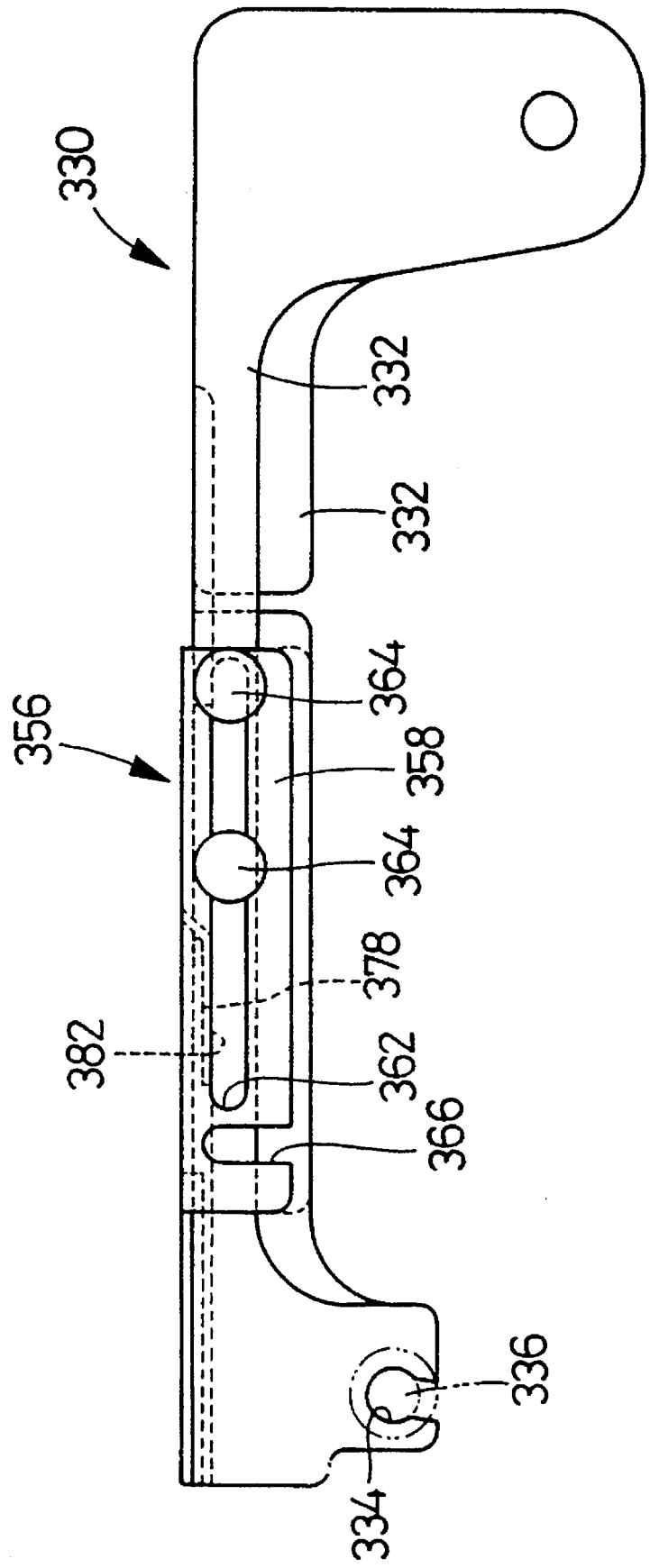
FIG. 22 is a front view of the cover member and shutter of FIG. 21.

In the third embodiment, a cover member 330 which covers the cartridge frame 270 includes a pair of side plates 332, 332 with which the cover 330 is rotatably attached to the frame 270. As shown in FIG. 22, a recess 344 formed in a front end portion of the cover member 330 is engaged with a support pin 336 projecting from the frame 270. The recess 344 includes a circular portion which just fits on the support pin 336, and a neck portion whose width is slightly smaller than that of the circular portion. The recess 344 is engaged with the pin 336 by 'snap action', i.e., elastic deformation of the neck portion of the recess 344, so that the cover member 330 is held in close contact with a top surface of the carrier tape 22 with substantially no clearance therebetween.

Figure 21:
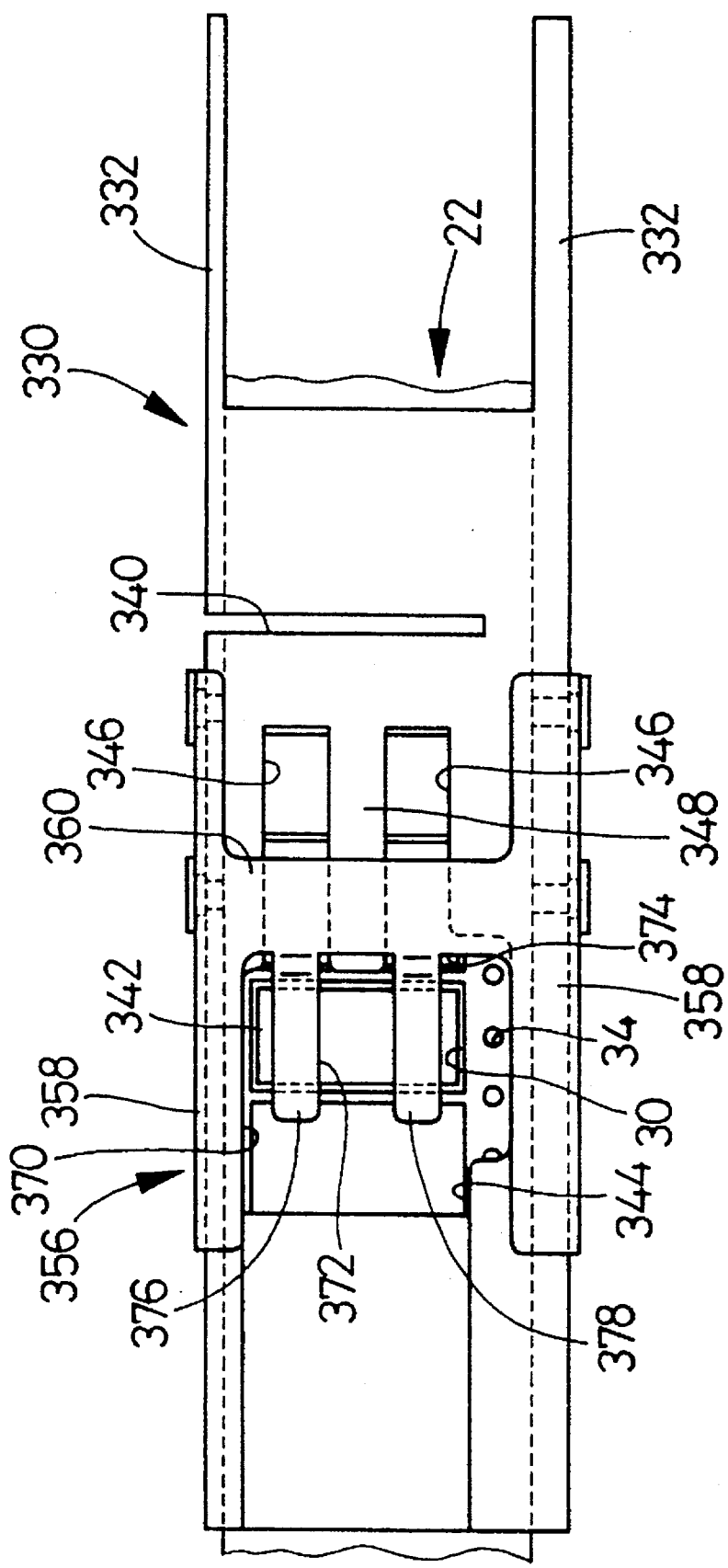
FIG. 21 is a plan view of a cover member and a shutter of the cartridge of FIG. 19.

As shown in FIG. 21, the cover member 330 has a slit 340 through which a cover film 26 of the carrier tape 22 is withdrawn, and an opening 344 through which an electronic component 342 is picked up. The opening 344 is located at a predetermined EC-component picking-up position. The component 342 has no lead. The cover member 330 additionally has a pair of fitting recesses 346, 346 which extend, toward the upstream of the tape feeding direction, from an upstream-side edge of the opening 344. The cover 330 also has a fixed jumping-preventing slip 348 formed between the two fitting recesses 346, 346. The slip 348 has a bottom surface 350 functioning as a fixed jumping-preventing surface (FIG. 19).

The two fitting recesses 346, 346 are formed to be symmetrical with respect to the center line between the two movable rails 274, 276, and the fixed jumping-preventing slip 348 or surface 350 is formed to be just in alignment with the center line of the rails 274, 276.

A shutter 356 is attached to the cover member 330 such that the shutter 356 is movable relative to the cover 330 in a direction parallel to the tape feeding direction. The shutter 356 includes a pair of slide portions 358, 358 which are supported by the cover member 330 such that the slide portions 358 are movable or slideable in the tape feeding direction. The shutter 356 additionally includes a connection portion 360 which extends in the widthwise direction of the cartridge frame 270 and connects the two slide portions 358, 358 with each other.

As shown in FIG. 22, each of the two slide portions 358, 358 has an elongate hole 362 extending parallel to the tape feeding direction. Similar to the stepped pins 192 shown in FIG. 6, stepped pins 364 are attached to the cover member 330 through the holes 362. The holes 362 and the pins 364 cooperate with each other to guide the shutter 356 in the tape feeding direction. One of the slide portions 358 has a vertically extending recess 366 in which a projection 368 of the rotary plate 326 fits as shown in FIG. 19. When the rotary plate 326 is rotated in a forward and a backward direction thereof, the shutter 356 is advanced and retracted in the tape feeding direction.

The connection portion 360 has a groove 372 at a location thereof corresponding to the center line between the two movable rails 374, 376, and two grooves 370, 374 at respective locations thereof corresponding to respective outside portions of the cover member 330 which respectively define from outside the two fitting recesses 346, 346. Each groove 370, 372, 374 extends toward the downstream of the tape feeding direction. Thus, the connection portion 360 has two jumping-preventing slips 376, 378 at respective locations thereof corresponding to the two fitting recesses 346, 346. The two slips 376, 378 are fitable in the corresponding recesses 346, 346, respectively.

As shown in FIG. 22, the slips 376, 378 are bent downward at respective base portions thereof so that respective bottom surfaces 380, 382 of the bent slips 376, 378 are flush with the fixed jumping-preventing surface 350 of the cover member 330 and function as movable jumping-preventing surfaces. The groove 372 between the slips 376, 378 has a width which is greater than a diameter of a suction nozzle used for picking up an electronic component 342 of the larger size and is smaller than a width of an electronic component 342 of the smaller size. As is apparent from FIG. 20, the present cartridge can supply two sorts of carrier tapes 22 having different widths, i.e., carrying two sorts of components 342 having different sizes or widths.

In the third embodiment, the spacing of the two movable rails 274, 276 can be changed, if necessary, before the commencement of supplying of the carrier tape 22. In order to change the rail spacing, first, the cover member 330 and the shutter 356 are retracted away from the cartridge frame 270. In this situation, the movable rails 274, 276 are symmetrically moved in the lateral direction of the rails 274, 276, such that the center line between the rails 274, 276, i.e., the center of the rail spacing is not changed even after the rail spacing is increased or decreased.

When the rail spacing is changed, the sprocket 312 is moved together with the movable rail 276. Carrier tapes 22 of different sizes have pockets 30 or openings 32 having different widths, respectively, and have different distances of two side portions 28, 28, respectively. However, in the present embodiment, the two size-different carrier tapes 22 may have a common width that is the width of one of the two side portions 28, 28 thereof which supports perforations 34. In such two carrier tapes, the respective distances between the series of pockets 30 and the perforations 34 formed in one side portion 28 do not differ from each other. Thus, the two sorts of carrier tapes 22 can be manufactured easily.

Similar to the first and second embodiments, the feeding of the carrier tape 22 is carried out as the rotary plate 326 is rotated in the forward direction thereof by an air cylinder (not shown). In this situation, first, the ratchet wheel 324 is rotated by the movement of a ratchet pawl (not shown). This rotation is transmitted to the sprocket 312 via the first and second spline sleeves 310, 314, and the rotation of the sprocket 312 acts on the carrier tape 22.

When the carrier tape 22 is fed, the shutter 356 is advanced by the rotation of the rotary plate 326. An electronic component 342 is fed to the EC picking-up position while the widthwise opposite ends of the component 342 are covered by the two movable jumping-preventing slips 376, 378, respectively. In synchronism with the feeding of the component 342, the suction nozzle 172 is lowered and, after the stopping of feeding of the component 342, the suction nozzle 172 reaches the component 342 through the groove 372 provided between the two slips 376, 378, and applies air suction to the component 342. Following the air suction of the component 342, the shutter 356 is retracted away from the EC picking-up position, and the slips 376, 378 are retracted away from the component 342, so that the suction nozzle 172 is lifted up so as to pick up the component 342 from the pocket 30.

The electronic component 342 is held down by the movable jumping-preventing slips 376, 378 until the air suction of the component 342 by the suction nozzle 172 is completed. Thus, the component 342 is effectively prevented from jumping out of the pocket 30 while the component 342 is fed to the EC picking-up position. In addition, the component 342 is prevented from standing upright on its side, or any other trouble in connection with the air suction of the component 342.

As described above, the groove 372 between the two movable jumping-preventing slips 376, 378 has a width which is greater than the diameter of the suction nozzle used for picking up the component 342 of the larger size and is smaller than the width of the component 342 of the smaller size. Therefore, the cover member 330 or the shutter 356 need not be changed with another cover member or another shutter, even when the carrier tape 22 carrying the small-size components 342 is supplied by the present cartridge. The slips 376, 378 of the shutter 356 effectively prevent the small-size components 342 from jumping out of the pockets 30 when the carrier tape 22 carrying the components 342 is supplied, and the groove 372 between the two slips 376, 378 permits the air-suction nozzle to pass therethrough to pick up the component 342 from the pocket 30.

In the present embodiment, the respective outer side ends of the side portions 28, 28 of the carrier tape 22 are guided by the guiding surfaces 300, 302 of the movable rails 274, 276, respectively. When the spacing of the rails 274, 278 is changed, the spacing of the guiding surfaces 300, 302 is also changed, so that the respective outer side ends of each carrier tape 22 is guided by the guiding surfaces 300, 302.

Two pairs of cover members 330 and shutters 356 may be used. In this case, when the spacing of the movable rails 274, 276 is changed, an appropriate pair of cover member and shutter 330, 356 are selected depending upon the size or width of electronic components 342 carried by a carrier tape 22 to be supplied. For example, in the case where a pair of cover member and shutter 330, 356 for large-size components 342 cannot hold down the respective widthwise side ends of small-size components 342, the first pair of cover member and shutter 330, 356 are replaced by the other pair of cover member and shutter 330, 356 wherein the slips 376, 378 of the shutter 356 can hold down the side ends of the small-size components 342 and the groove 372 permits a suction nozzle for the large-size components 342 to pass therethrough.

As is apparent from the foregoing description, in the third embodiment, the movable rails 274, 276 function as the movable rail adjusting members; the rails 274, 276 cooperate with the guiding device 282, 284 to provide the rail-spacing adjusting device; and the sprocket 312 and the guide surfaces 300, 302 of the rails 274, 276 cooperate with each other to provide a positioning device for positioning the carrier tape 22 in the lateral direction thereof.

Figure 23:
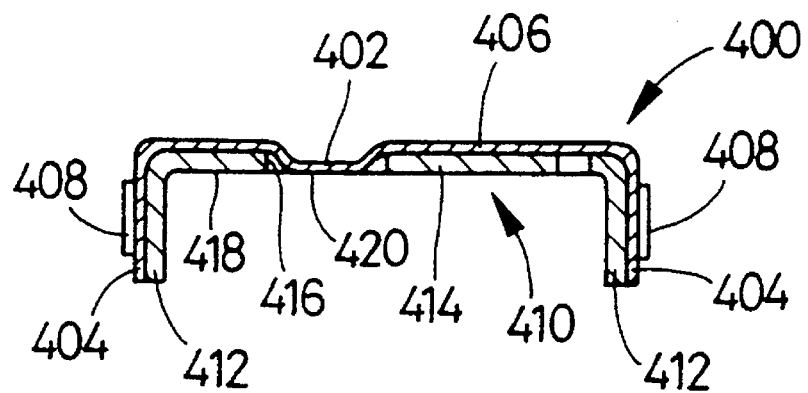
FIG. 23 is a view of a cover member and a shutter of another electronic-component supplying cartridge as a fourth embodiment of the invention.
Figure 24:
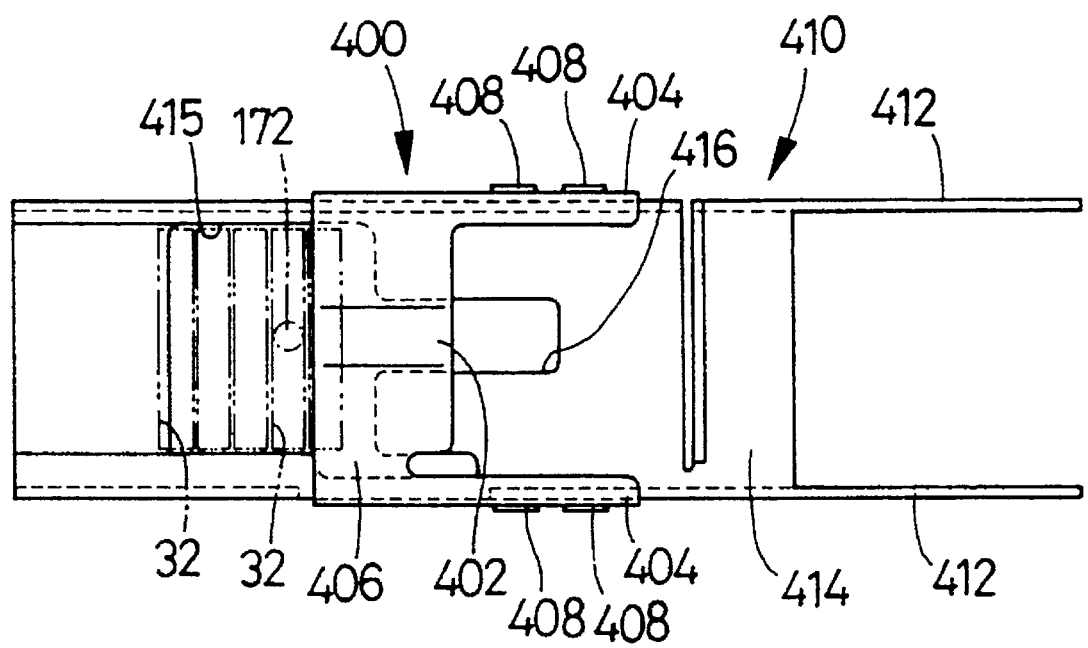
FIG. 24 is a plan view of the cover member and shutter of FIG. 23.

While in the first and second embodiments shown in FIGS. 1 to 18 the shutter 180 has the linear jumping-preventing tongue 194 for preventing the electronic components 20 from jumping out of the pockets 30 or openings 32, it is possible to employ a shutter 400, shown in FIGS. 23 and 24, which has a jumping-preventing portion 402 having a wide area. The shutter 400 has two slide portions 404, 404 and a connection portion 406 connecting the two slide portions 404, 404 with each other. Like the slide portions 182, 182 of the shutter 180 shown in FIG. 6, the slide portions 404, 404 are respectively attached to two side plates 412, 412 of a cover member 410, each with an elongate hole (not shown) and stepped pins 408, 408, such that the shutter 400 is movable relative to the cover member 410. The connection portion 406 of the shutter 400 is positioned on a top plate 414 of the cover member 410.

The cover member 410 has an opening 415 through which the electronic components are picked up, and a recess 416 which is formed in a central portion of the top plate 414 in the widthwise direction thereof and extends, toward the upstream of the tape feeding direction, from an upstream-side edge of the opening 415. The recess 416 has a width smaller than the widthwise dimension of an electronic component of the smallest size that is supplied by the present cartridge. The jumping-preventing portion 402 of the shutter 400 is formed by press-working a portion of the connection portion 406 which corresponds to the recess 416 in the widthwise direction of the cartridge. The jumping-preventing portion 402 having a widened area protrudes from the connection portion 406 toward the top plate 414. The preventing portion 402 has a width which ensures that the portion 402 fits in the recess 416, and fits in the recess 416 such that the portion 402 is movable relative to the cover 410 in the tape feeding direction. A bottom surface 418 of the top plate 414 and a bottom surface 420 of the jumping-preventing portion 402 are flush with each other. The bottom surface 418 functions as a fixed or immovable jumping-preventing surface, and the bottom surface 420 functions as a movable jumping-preventing surface.

When the shutter 400 is moved to, and located at, the retracted position thereof away from the EC picking-up position, the jumping-preventing portion 402 prevents an electronic component from jumping out of a pocket 30 or an opening 32 which is adjacent to a pocket 30 currently positioned at the EC picking-up position and follows the latter pocket 30 in the tape feeding direction or order. Meanwhile, when the carrier tape is fed, the preventing portion 402 advances while covering the opening 32 of the former pocket 30; and when a suction head 172 reaches the component in the former pocket 30, the shutter 400 is retracted to the retracted position thereof. Since the recess 416 of the cover member 410 has a width smaller than the width of the smallest-size component, the jumping of the component from the pocket 30 or opening 32 is continuously prevented by at least one of the preventing portion 402 and the recess 416-defining portions of the cover member 410, until the component in issue is sent to, and located at, the EC picking-up position.

Since the preventing portion 402 of the shutter 400 provides an extended or widened area for preventing an electronic component from jumping out of a pocket 30 or opening 32, the portion 402 can hold down the component over an increased area in the widthwise direction of the component. Thus, a single shutter 400 may be used for various components having different widths falling within a wider range. Therefore, the frequency of changing of shutters 400 decreases, and the overall work needed to the size changing also decreases. Since a smaller number of shutters 300 suffice, the production cost of the cartridge is reduced.

While the present invention has been described in its preferred embodiments, the present invention may otherwise be embodied.

For example, in each of the first to fourth embodiments, the backward-direction stopping device includes the rotary member 120 as the movable member thereof. However, the rotary member 120 as the movable member may be replaced by a linearly movable member.

The free-movement preventing device for preventing the free movement of the movable member 120 relative to the cartridge frame 40, 240, 270 is not limited to the bolt 118. For example, the preventing device may be provided by a positioning device similar to the positioning device 256 employed in the second embodiment shown in FIGS. 16–18, and a plurality of notches engageable with a ball member of the positioning device. In this case, the positioning device may be provided in the cartridge frame, or in an attachment member attached to the frame, and the notches may be formed in the movable member, or vice versa. In the latter case, the operator need not loosen or fasten any bolts for adjusting the position of the movable member relative to the cartridge frame, but has only to move the movable member for the same purpose.

In each of the illustrated embodiments, the pitch of feeding of the carrier tape 22 is changed by not changing the limit of forward-direction rotation or movement of the rotary plate 72 as the driver member of the tape feeding device, but changing the limit of backward-direction movement of the driver member. The tape feeding pitch may be changed by vice versa, i.e., not changing the limit of backward-direction movement of the driver member but changing the limit of forward-direction movement of the same. In the latter case, the EC picking-up position with respect to the tape feeding direction changes with the tape feeding pitch. Hence, the EC supplying cartridge 10 and the EC suction nozzle 172 are moved relative to each other in the tape feeding direction, so that the suction nozzle 172 can pick up the electronic components 20, 342.

In each of the illustrated embodiments, the limit of forward-direction rotation or movement of the rotary plate 72 as the driver member of the tape feeding device is indirectly defined by defining the limit of movement of the ratchet pawl 80, and the limit of backward-direction movement of the driver member is indirectly defined by defining the limit of extension or advancement of the piston rod 68. However, the limits of movement of the driver member may be defined in other manners. For example, the limit of forward-direction movement of the driver member may be defined by defining the limit of retraction of the piston rod 68, and the limit of backward-direction movement of the driver member may be defined by defining the limit of retracting movement of the shutter 180, 356, 400. In short, the limits of movement of the driver member can indirectly be defined by defining the limit or limits of movement of any member which moves together with the driver member. Moreover, the limits of movement of the driver member can directly be defined in various manners.

In each of the illustrated embodiments, the EC supplying cartridge 10 includes the air cylinder 66 as the drive source for driving the driver member of the tape feeding device, and the air cylinder 66 is mounted on the cartridge frame 40, 240, 270. However, the air cylinder 66 may be replaced by other drive sources, and may be provided separately from the frame 40, 240, 270.

There is known an electronic-component (EC) mounting apparatus which can take electronic components from a carrier tape fed by the EC supplying cartridge 10, and mount the components on an object such as a printed circuit board (PCB). The mounting apparatus includes a turn table rotatable about an axis line and a number of EC picking-up suction nozzles mounted on the table. When the table is turned or rotated, each nozzle is moved to a plurality of operation positions where the nozzle picks up the components and mounts the same on the PCB. This mounting apparatus also includes a drive motor for rotating the turn table. In the case where the EC supplying cartridge in accordance with the present invention is used with this mounting apparatus, the drive motor may be used as the drive source for driving the tape feeding device of the cartridge.

In the above case, it is required that the rotation of the table, the moving-up and -down of each nozzle, and the picking-up and mounting of the components by each nozzle be synchronized with the feeding of the carrier tape 22. This synchronization may be assured by the employment of a specific cam which is rotated by the motor. To this end, between the motor and the driver member of the tape feeding device, there are provided the cam which is rotated by the motor, a cam follower which moves following a cam surface of the cam when the cam is rotated, and a motion transmitting device which converts the motion of the cam follower into the forward- and backward-direction movements of the driver member.

If, in the same case, the EC supplying cartridge 10 employs the shutter 180 shown in FIG. 12, the cam surface of the cam is designed to ensure that each suction nozzle contacts, and holds by air suction, an electronic component at the EC picking-up position, after the shutter 180 is retracted away from the component. On the other hand, if the cartridge 10 employs the shutter 356 shown in FIG. 21, the cam surface of the cam is designed to ensure that the feeding of an electronic component to the EC picking-up position is done in synchronism with the moving-down of each nozzle and the shutter 356 is retracted away from the component after the nozzle holds by air suction the component at the picking-up position.

It is not essentially required that the air cylinder 66 be provided to extend parallel to the tape feeding direction. The air cylinder 66 may be provided not to extend parallel to the tape feeding direction. In the latter case, it is preferred that the direction of movement of the stopper block 70 as the movable stopper member of the tape feeding device be parallel to the axis line about which the rotary member 120 of the tape feeding device is rotatable.

In each of the illustrated embodiments, a plurality of EC supplying cartridges 10 in accordance with the invention are mounted on the support table such that the respective EC picking-up positions of the cartridges 10 are aligned with a single straight line, so that the suction nozzle 172 can pick up the electronic components 20, 342 when being moved in the X direction. However, the picking-up of the components from the carrier tape 22 by the nozzle 172 may be done by only the relative movement of the nozzle 172 and the cartridge 10 in the horizontal plane. This relative movement may be obtained by any device which moves one or both of the nozzle 172 and the cartridge 10 relative to each other.

For example, in the case where the suction nozzle 172 is attached to a turn table rotatable about a vertical axis line and the nozzle 172 is moved to the EC picking-up position when the table is rotated, the support table on which the cartridges 10 are mounted is moved in the X direction by an X-direction moving device, so that one of the cartridges 10 is moved to the EC picking-up position.

In the case where the limit of forward-direction movement of the rotary plate 72 as the driver member of the tape feeding device can be changed to different positions, the support table on which the cartridges 10 are mounted is moved in the Y direction by a Y-direction moving device, so that each of the cartridges 10 is moved to the picking-up position just below the suction nozzle 172.

Moreover, either one of the suction nozzle 172 and the support table on which the EC supplying cartridges 10 are mounted may be designed to be movable both in the X and Y directions.

In each of the illustrated embodiments, the EC supplying cartridges 10 are mounted on the support table such that the respective EC picking-up positions of the cartridges 10 are aligned with the single reference line, and cooperate with each other to provide an EC supplying apparatus. However, the cartridges 10 may be arranged on the support table such that the respective picking-up positions of the cartridges 10 are arranged along an arc.

In the case where a carrier tape 22 is changed with another carrier tape 22 carrying electronic components 20, 342 having a very small width, the EC-jumping preventing tongue, slip, or portion 194, 376, 378, 402 of a shutter 180, 356, 400 may not prevent the jumping of the components out of the pockets 30 of the tape. In this case, the shutter is replaced by another shutter having such an EC-jumping preventing tongue, slip, or portion which can prevent the jumping of the components from the tape. For example, the shutter 180 used in the embodiment shown in FIGS. 1 to 15, can prevent the jumping from the tape of an electronic component having a width which ensures that the component occupies the space between the two rails 60, 60, over the center line of the same 60, 60, to one half space on the side of one rail 60 on which side the sprocket 90 or the ratchet wheel 86 is not provided. In the case, however, where the cartridge 10 supplies an electronic component having so small a width that the component is positioned within the other half space on the side of the other rail 60 on which side the sprocket 90 and the ratchet wheel 86 are provided, the EC-jumping preventing tongue 194 of the shutter 180 may not prevent the jumping of the component from the tape. In the last case, therefore, the shutter 180 is replaced by another shutter having an EC-jumping preventing tongue which can prevent the jumping of the component from the tape.

The shutter 180 may be changed with another shutter, each time a carrier tape 22 carrying a certain sort of electronic components 20 is changed with another carrier tape carrying another sort of components having a different width. A suitable one of the shutters 180 is selected depending upon the width of the components to be supplied, so that the EC-jumping preventing tongue 194 of the selected shutter 180 can hold down the widthwise central portion of each component, thereby preventing the jumping of the component from the pocket 30 of the carrier tape.

In the carrier tape 22, the pockets 30 may be formed in the EC accommodating tape 24 in such a manner that the pockets 30 are positioned at the widthwise central portion of the EC supplying cartridge 10 independently of the sizes of electronic components 20 accommodated in the pockets 30. In the latter case, the EC picking-up position with respect to the X direction does not move or change even if a carrier tape 22 carrying a certain sort of electronic components 20 is changed with another carrier tape carrying another sort of components having a different width. Thus, the X-direction position where the suction head 172 is stopped to pick up the components does not require any adjustment, and the shutter 180 need not be replaced with another shutter.

In the embodiment shown in FIGS. 1 to 15, the rear end portion of the cover member 62 fits on the sixth axis member 146 supported by the cartridge frame 40, and a stopper ring is used to prevent the cover member 62 from coming out of the axis member 146. However, the cover member 62 may be attached to the frame 40 in other manners. For example, similar to the cover member 330 shown in FIG. 22 wherein the front end portion thereof is attached to the cartridge frame 270 by the cooperation of the recess 334 and the support pin 336, a support pin may be press-fit in the frame 40 in the widthwise direction thereof, such that opposite axial ends of the pin project from the frame 40 on both sides of the same 40, respectively, and two recesses formed in the rear end portion of the cover member 62 may fit on the two axial ends of the pin, respectively. In the last case, the front end portion of the cover member 62 may be attached to the frame 40 by the cooperation of the engaging recess 150 and the engaging member 152, as shown in FIG. 6, or alternatively by the cooperation of a recess 334 and a support pin 336, as shown in FIG. 22.

In the above case, the cover member 62 can easily be attached to, and detached from, the cartridge frame 40. Thus, the cover member 62 can quickly be replaced with another, when the shutter 180 is replaced with another depending upon the size of electronic components 20 to be supplied by the EC supplying cartridge 10.

If, in the same case, slits are formed around the recesses of the rear end portion of the cover member 62, the rear end portion is easily elastically deformed, so that the cover member 62 can more easily fit on the support pin.

Moreover, in each of the illustrated embodiments, the electronic components 20, 342 are prevented from jumping out of the pockets 30 or openings 32 of the carrier tape 22, by the cover member 62 and the shutter 180 which are attached to the cartridge frame 40 such that the cover member 62 is not movable, and the shutter 180 is movable, relative to the frame 40 in the tape feeding direction. However, the jumping of the components from the carrier tape can be prevented in other ways. For example, the cover member may be formed integrally with the shutter, and the jumping of the components from the carrier tape can be prevented by the movement of the cover member in the tape feeding direction.

In each of the illustrated embodiments, the EC supplying cartridge 10 may be modified such that the modified cartridge can supply only a sort of carrier tapes 22 having a predetermined common width and can be adjusted with respect to only the tape feeding pitch.

The present invention may otherwise be embodied by changing the manner of combination of the elements of each of the illustrated embodiments, e.g., by combining some of the elements of one embodiment with some of the elements of another or other embodiments.

It is to be understood that the present invention may be embodied with other changes, improvements, and modifications that may occur to those skilled in the art without departing from the spirit and scope of the invention defined in the appended claims.

What is claimed is:

1. A cartridge for supplying a carrier tape which carries a plurality of electronic components, the tape having a plurality of pockets for accommodating the respective components, and a pair of side portions on both sides of the pockets, the pockets projecting downward from the side portions, the cartridge comprising:

a cartridge frame;

a tape feeding device mounted on said cartridge frame, for feeding said carrier tape in a feeding direction;

a pair of rails provided on said cartridge frame such that said rails extend parallel to said feeding direction, said pair of rails supporting said pair of side portions of said carrier tape, respectively, and permitting movement of said pockets of the tape when the tape is fed on the rails by said tape feeding device;

a tape positioning device which positions said carrier tape with respect to a lateral direction in which said pair of side portions of the tape are spaced from each other; and a rail adjusting device which adjusts a spacing between said pair of rails to each of a plurality of different values.

2. A cartridge according to claim 1, wherein said rail adjusting device comprises a removable rail adjusting member which is removably attached to said cartridge frame, said adjusting member providing at least one of said pair of rails.

3. A cartridge according to claim 1, wherein said rail adjusting device comprises:

a movable rail adjusting member which is attached to said cartridge frame such that said adjusting member is movable in said lateral direction; and an adjusting-member positioning device which positions said movable rail adjusting member at each of a plurality of different positions in said lateral direction.

4. A cartridge according to claim 1, wherein said rail adjusting device comprises a rail adjusting member providing one of said pair of rails, the other rail being provided as a part of said cartridge frame.

5. A cartridge according to claim 1, wherein said rail adjusting device comprises a pair of rail adjusting members providing said pair of rails, respectively, said rail adjusting device adjusting a spacing between said pair of rail adjusting members such that a center of said spacing does not change even after said spacing is adjusted to said each of said different values.

6. A cartridge according to claim 1, wherein said tape feeding device comprises:

a driver member which is movable in a first direction and a second direction different from said first direction;

a feeding mechanism which feeds said carrier tape based on the movement of said driver member in said first direction and does not transmit, to the tape, the movement of the driver member in said second direction;

a first-direction stopper which defines a first limit of movement of said driver member in said first direction; and a second-direction stopper which defines a second limit of movement of said driver member in said second direction.

7. A cartridge according to claim 6, further comprising a drive source for driving said driver member of said tape feeding device, said drive source being mounted on said cartridge frame.

8. A cartridge according to claim 7, wherein said drive source comprises an air cylinder.

9. A cartridge according to claim 6, wherein said second-direction stopper comprises:

a first stopper member which is movable together with said driver member;

a movable member which is attached to said cartridge frame such that said movable member is movable and adjustable with respect to a position thereof relative to the frame;

at least one second stopper member which is provided on said movable member and defines said second limit of movement of said driver member by abutting said first stopper member movable with the driver member; and a free-movement preventing device which prevents a free movement of said movable member relative to said cartridge frame.

10. A cartridge according to claim 9, wherein said second-direction stopper further comprises an attachment member secured to said cartridge frame, said movable member being attached to said attachment member such that the movable member is movable, relative to the attachment member, to a position thereof where the movable member causes a portion of the attachment member to be exposed and opposed to said first stopper member movable with said driver member.

11. A cartridge according to claim 9, wherein said movable member of said second-direction stopper comprises a rotary member which is rotatable about an axis line, said at least one second stopper member comprising a plurality of second stopper members provided along a circle whose center rides on said axis line of said rotary member.

12. A cartridge according to claim 1, further comprising:

a taking-up device which has a take-up drum and takes up, around said take-up drum, a cover film covering respective openings of said pockets of said carrier tape being fed by said tape feeding device; and a holder device which holds a tape storage device in which said carrier tape is stored, said holder device holding said tape storage device such that the tape is continuously fed from the storage device to said pair of rails, said take-up drum being positioned relative to said tape storage device and said pair of rails such that said carrier tape is fed from the storage device to the rails by being guided by a guide roller provided by said take-up drum or said cover film being wound around the drum.

13. A cartridge according to claim 12, wherein said carrier tape is engaged with a portion of a circumferential surface of said guide roller such that a direction of feeding of the tape from said tape storage device to said pair of rails via said portion of the roller is same as a direction of movement of said portion of the roller.

\* \* \* \* \*